(12) United States Patent
Cho et al.

(10) Patent No.: US 9,614,505 B1
(45) Date of Patent: Apr. 4, 2017

(54) DIFFERENTIAL DRIVING CIRCUIT INCLUDING ASYMMETRY COMPENSATION CIRCUIT

(71) Applicant: ELECTRONICS AND TELECOMMUNICATIONS RESEARCH INSTITUTE, Daejeon (KR)

(72) Inventors: Min-Hyung Cho, Daejeon (KR); Yi-Gyeong Kim, Daejeon (KR); Chun-Gi Lyuh, Daejeon (KR); Young-deuk Jeon, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 15/232,701

(22) Filed: Aug. 9, 2016

(30) Foreign Application Priority Data

Feb. 22, 2016 (KR) ........................ 10-2016-0020732

(51) Int. Cl.
*H03K 5/12* (2006.01)
*H03K 5/04* (2006.01)
*H03K 17/687* (2006.01)

(52) U.S. Cl.
CPC ............. *H03K 5/04* (2013.01); *H03K 17/687* (2013.01)

(58) Field of Classification Search
CPC ....... H03K 19/00361; H03K 19/00384; H03K 5/04; H03K 5/12; H03K 17/687
USPC ........ 327/170, 172–175, 108–112, 427, 434, 327/437; 326/82, 83, 87
See application file for complete search history.

(56) References Cited

U.S. PATENT DOCUMENTS

| 5,767,703 | A | 6/1998 | Fattori et al. |
| 6,154,061 | A | 11/2000 | Boezen et al. |
| 6,657,468 | B1 * | 12/2003 | Best ................ H03K 19/01742 327/170 |
| 8,004,330 | B1 * | 8/2011 | Acimovic ........ H03K 19/00361 327/108 |
| 2004/0124905 | A1 * | 7/2004 | Haase ................... H03K 5/151 327/437 |
| 2006/0170451 | A1 * | 8/2006 | Jordanger ........ H03K 19/00346 326/34 |

(Continued)

OTHER PUBLICATIONS

"TJA1051 High-speed CAN transceiver, Rev. 6", Product data sheet, Mar. 25, 2011, pp. 1-21, NXP Semiconductors.

*Primary Examiner* — Lincoln Donovan
*Assistant Examiner* — Thomas Skibinski

(57) ABSTRACT

A differential driving circuit according to embodiments of the inventive may include a first driver drives a first pad to a first voltage according to a first driving signal, a second driver drives a second pad to a second voltage according to a second driving signal, a first and second capacitors for receiving a first and second voltage changes of the first and the second pad at one end thereof respectively to transmit the first and the second voltage change to the other end thereof respectively in a transition interval in which voltages of the first and second pads are changed, transition interval voltage adder circuit adds voltages respectively transmitted thereto through the first and second capacitors, and a transition interval asymmetry compensation circuit adjusts a slope of at least one of the first and second driving signals according to the added voltage.

17 Claims, 17 Drawing Sheets

(56) References Cited

U.S. PATENT DOCUMENTS

| | | |
|---|---|---|
| 2008/0122538 A1 | 5/2008 | Park et al. |
| 2009/0224808 A1* | 9/2009 | Avalur ................ G06F 13/4072 327/108 |
| 2011/0032134 A1 | 2/2011 | Cho et al. |

* cited by examiner

DIFFERENTIAL DRIVING CIRCUIT INCLUDING ASYMMETRY COMPENSATION CIRCUIT

CROSS-REFERENCE TO RELATED APPLICATION

This U.S. non-provisional patent application claims priority under 35 U.S.C. §119 of Korean Patent Application No. 10-2016-0020732, filed on Feb. 22, 2016, the entire contents of which are hereby incorporated by reference.

BACKGROUND

The present disclosure herein relates to a semiconductor device, and more particularly, to a differential driving circuit used for communication between semiconductor devices.

As the IT technology combined with automobile technology is diversified, functions and kinds of semiconductor devices mounted on a vehicle are also being diversified. Accordingly, communication techniques between semiconductor devices in an automobile system have become important.

In the communication between semiconductor devices, a differential driving circuit, which is immune to noises and is capable of transmitting and receiving data with a high speed, are widely used. The controller area network (CAN) communication method which is one of interfaces used in automobile systems is a kind of communication methods using such a differential driver. The CAN communication method is developed for data transmission between modules in a vehicle, is immune to noises, and has various error compensation functions. Thus, the CAN communication method is most widely used for data transmission and reception which are necessary for vehicle control in a vehicle requiring high safety.

In designing such a CAN bus driving circuit, the symmetry of an output signal of a differential driver is one of important characteristics which should be first considered. When the symmetry characteristic of the output signal of the CAN bus driving circuit is degraded, the common mode voltage of the output signal is changed over time. As a result, the electro-magnetic interference (EMI) characteristic of the CAN bus driving circuit is degraded. Especially, since the CAN communication method is mainly used inside a vehicle, the degradation of the EMI characteristic is an important problem which can affect the safety of vehicles.

SUMMARY

The present disclosure provides a differential driving circuit including an asymmetry compensation circuit for improving the symmetry of a differential driver in the communication between semiconductor devices.

An embodiment of the inventive concept provides a differential driving circuit which may include a first driver, a second driver, a first capacitor, a second capacitor, a transition interval voltage adder circuit, and a transition interval asymmetry compensation circuit. The first driver may drive a first pad at a first voltage according to a first driving signal. The second driver may drive a second pad at a second voltage according to a second driving signal. The first capacitor may receive a voltage change of the first pad at one end thereof and transmit to the other end thereof in a transition interval in which voltages of the first and second pads are changed. The second capacitor may receive voltage change of the second pad at one end thereof and transmit to the other end thereof in the transition interval. The transition interval voltage adder circuit may add voltages respectively transmitted thereto through the first and second capacitors. The transition interval asymmetry compensation circuit may adjust a slope of at least one of the first and second driving signals according to the added voltage of the transition interval voltage adder circuit and thereby compensate asymmetry in slew rates of the first and second drivers in the transition interval.

BRIEF DESCRIPTION OF THE FIGURES

Embodiments of the inventive concept are illustrated not as a limiting means but as an example, and in the accompanying drawings, like numbers refer to like elements. The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
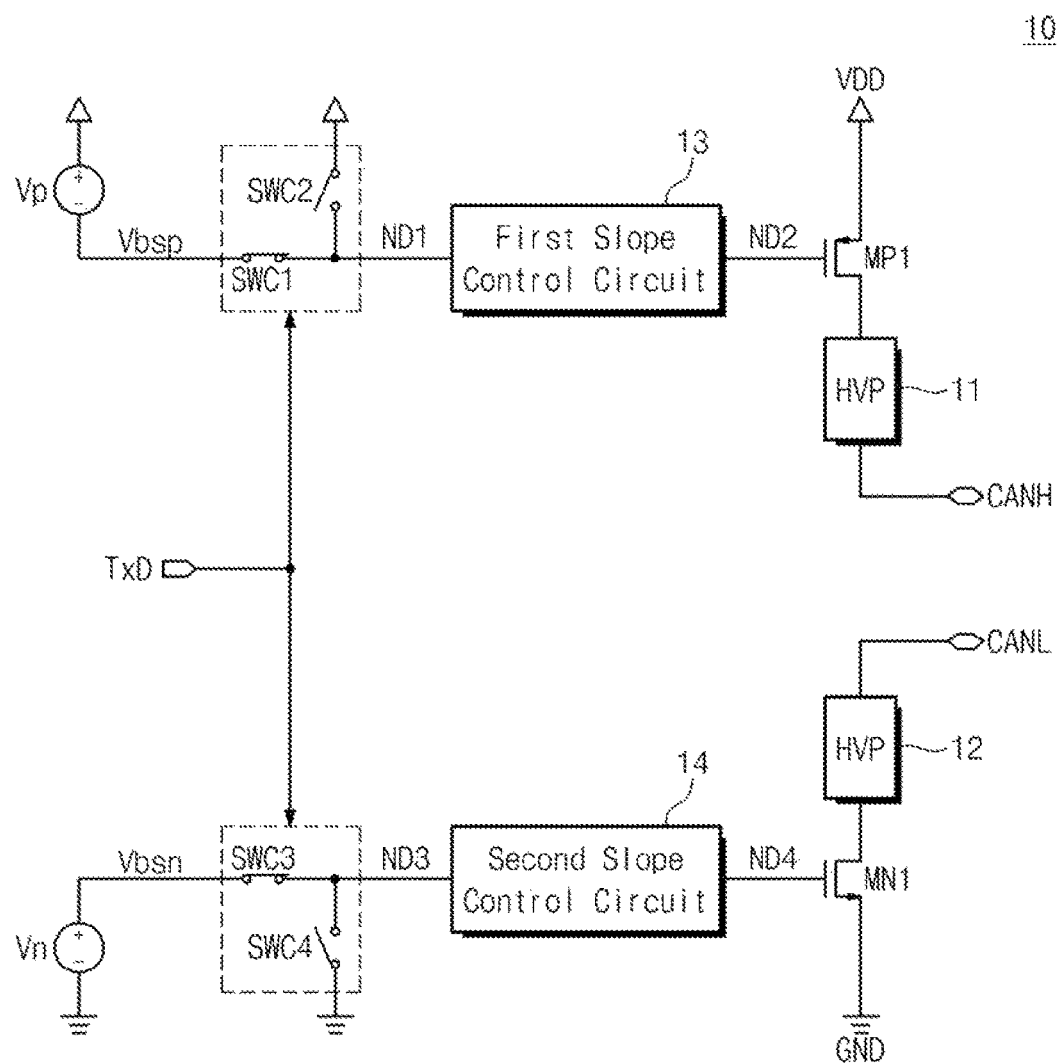
FIG. 1 is a circuit diagram illustrating a differential driving circuit according to an embodiment of the inventive concept.

It should be construed that foregoing general illustrations and following detailed descriptions are exemplified and an additional explanation of claimed inventive concept is provided. Reference numerals are indicated in detail in preferred embodiments of the inventive concept, and their examples are represented in reference drawings. In every possible case, like reference numerals are used for referring to the same or similar elements in the description and drawings.

Hereinafter, a differential driving circuit is used as an example for describing characteristics and functions of the inventive concept. However, those skilled in the art can easily understand other advantages and performances of the inventive concept according to the descriptions. The inventive concept may be embodied or applied through other embodiments. Besides, the detailed description may be amended or modified according to viewpoints and applications, not being out of the scope, technical idea and other objects of the present invention.

FIG. 1 is a circuit diagram illustrating a differential driving circuit according to an embodiment of the inventive concept. Referring to FIG. 1, a differential driving circuit 10 may include a first driving PMOS transistor MP1, a first driving NMOS transistor MN1, high voltage protection circuits (HVP) 11 and 12, high-side and low-side voltage sources Vp and Vn, first to fourth control switches SWC1 to SWC4, and first and second slope control circuits 13 and 14.

The first driving PMOS transistor MP1 and HVP 11 constitutes a high-side driver. The first driving PMOS transistor MP1 is connected between a first power supply voltage VDD and HVP 11. The gate of the first driving PMOS transistor MP1 is connected to the first slope control circuit 13 through a second node ND2. The first driving NMOS transistor MN1 and HVP 12 constitutes a low-side driver. The first driving NMOS transistor MN1 is connected between a second power supply voltage GND and HVP 12. The gate of the first driving NMOS transistor MN1 is connected to the second slope control circuit 14 through a fourth node ND4. For example, HVPs 11 and 12 may include diodes.

A load resistor (not shown) may be additionally connected to the outside of the differential driving circuit 10. The load resistor (not shown) is a termination resistor connected, as a load resistor, to both ends of a CAN bus having a differential serial structure. The load resistor (not shown) is connected between a high-side driver and a low-side driver. The value of the load resistor (not shown) may be determined according to a communication standard. For example, in CAN bus communication, two termination resistors of 120Ω are connected in parallel at the both ends of CAN bus. In this case, the resistance value of the load resistor (not shown) is determined as the equivalent resistance value of the above-mentioned termination resistor. That is, in this example, the resistance value of the load resistor (not shown) is 60Ω.

The high-side voltage source Vp is connected with the first control switch SWC1 through a node Vbsp. The high-side voltage source Vp provides the first driving PMOS transistor MP1 with a high-side bias voltage through the first control switch SWC1 and the first slope control circuit 13. The level of the high-side bias voltage is determined as a voltage level capable of driving the first driving PMOS transistor MP1.

The first control switch SWC1 is connected with the second control switch SWC2 and the first slope control circuit 13 through a first node ND1. The second control switch SWC2 is connected between the first power supply voltage VDD and the first node ND1. The first control switch SWC1 is operated at a complementary timing with the second control switch SWC2 according to a data signal TxD.

For example, when the data signal TxD is logic '0', the first control switch SWC1 is closed and the second control switch SWC2 is opened. Then, the voltage of the high-side voltage source Vp is provided to the first slope control circuit 13. On the contrary, when the data signal TxD is logic '1', the first control switch SWC1 is opened and the second control switch SWC2 is closed. Accordingly, the first power supply voltage VDD is provided to the first slope control circuit 13.

The first slope control circuit 13 is connected between the first node ND1 and the second node ND2. The first sloped control circuit 13 adjusts the slope of a voltage signal provided through the first node ND1.

A low-side voltage source Vn is connected with a third control switch SWC3 through a node Vbsn. The low-side voltage source Vn provides the first driving NMOS transistor MN1 with a low-side bias voltage through the third control switch SWC3 and the second slope control circuit 14. The level of the low-side bias voltage is determined as a voltage level capable of driving the first driving NMOS transistor MN1.

The third control switch SWC3 is connected with the fourth control switch SWC4 and the second slope control circuit 14 through a third node ND3. The fourth control switch SWC4 is connected between the second power supply voltage GND and the third node ND3. The third control switch SWC3 is controlled by the data signal TxD and is operated at the same timing as the first control switch SWC1. The fourth control switch SWC4 is controlled by the data signal TxD and is operated at the same timing as the second control switch SWC2.

The second slope control circuit 14 is connected between the third node ND3 and the fourth node ND4. The second sloped control circuit 14 adjusts the slope of a voltage signal provided through the third node ND3.

The differential driving circuit 10 operates as follows. The operation of the differential driving circuit 10 is divided into a dominant state and a recessive state. The dominant state is defined as a state in which the differential driving circuit 10 provides a node CANH and a node CANL with a differential signal. That is, in the dominant state, the differential driving circuit 10 provides a receiving end of another device with a logic '0' through the CAN bus. The recessive state is defined as a state in which the differential driving circuit 10 does not provide a node CANH and a node CANL with a differential signal. That is, in the recessive state, the differential driving circuit 10 provides a receiving end of another device with a logic '1'.

The operation in the dominant state is as follows. First, the data signal TxD of the logic '0' is provided to the first to fourth control switches SWC1 to SWC4. In response to the data signal TxD, the first and third control switches SWC1 and SWC3 are closed. At the same time, the second and fourth control switches SWC2 and SWC4 are opened. Subsequently, the voltage of the high-side voltage source Vp is provided to the first node ND1 through the first control switch SWC1. This voltage signal is applied to the second node ND2 while having a constant slope by the first slope control circuit 13. Also, the voltage of the low-side voltage source Vn is provided to the third node ND3 through the third control switch SWC3. This voltage signal is applied to the fourth node ND4 while having a constant slope by the second slope control circuit 14.

The first driving PMOS and the first NMOS transistors MP1 and MN1 are turned on by voltage signals provided to the above-mentioned second and fourth nodes ND2 and ND4. Then, a current flows from the first power supply voltage VDD to the node CANH. This current flows to the node CANL through a load resistor (not shown), and finally flows to the second power supply voltage GND. Accordingly, a differential signal is generated between the nodes CANH and CANL. The generated differential signal is provided to a receiving end of another electronic device connected to the differential driving circuit 10.

The operation in the recessive state is as follows. First, the data signal TxD of the logic '1' is provided to the first to fourth control switches SWC1 to SWC4. In response to the data signal TxD, the second and fourth control switches SWC2 and SWC4 are closed. At the same time, the first and third control switches SWC1 and SWC3 are opened. Subsequently, the first power supply voltage VDD is provided to the first node ND1 through the second control switch SWC2. This voltage signal is applied to the second node ND2 while having a constant slope by the first slope control circuit 13. Also, the second power supply voltage GND is provided to the third node ND3 through the fourth control switch SWC4. This voltage signal is applied to the fourth node ND4 while having a constant slope by the second slope control circuit 14.

The first driving PMOS and the first NMOS transistors MP1 and MN1 are turned off by a voltage signal provided to the above-mentioned second and fourth nodes ND2 and ND4. Accordingly, current does not flow through the load resistor (not shown). Accordingly, a differential voltage between the nodes CANH and CANL becomes 0 V. In general, the voltage in this case becomes a middle value between the first power supply voltage VDD and the second power supply voltage GND. The generated differential voltage of 0 V is provided to a receiving end of another electronic device connected to the differential driving circuit 10.

Hereinafter, a transition interval and a steady-state interval are defined for convenience of description. The transition interval is defined as a time interval in which the differential driving circuit 10 is changed from the dominant state to the recessive state and as a time interval in which the differential driving circuit 10 is changed from the recessive state to the dominant state. The steady-state interval is defined as a time interval in which the differential driving circuit 10 is maintained at the dominant state.

Referring to FIG. 1, the first power supply voltage is illustrated as the power supply voltage VDD, and the second power supply voltage is illustrated as an ground voltage GND. However, this should be construed as an example. Thus, both the first and second power supply voltages may have positive voltage levels or negative voltage levels.

Figure 2:
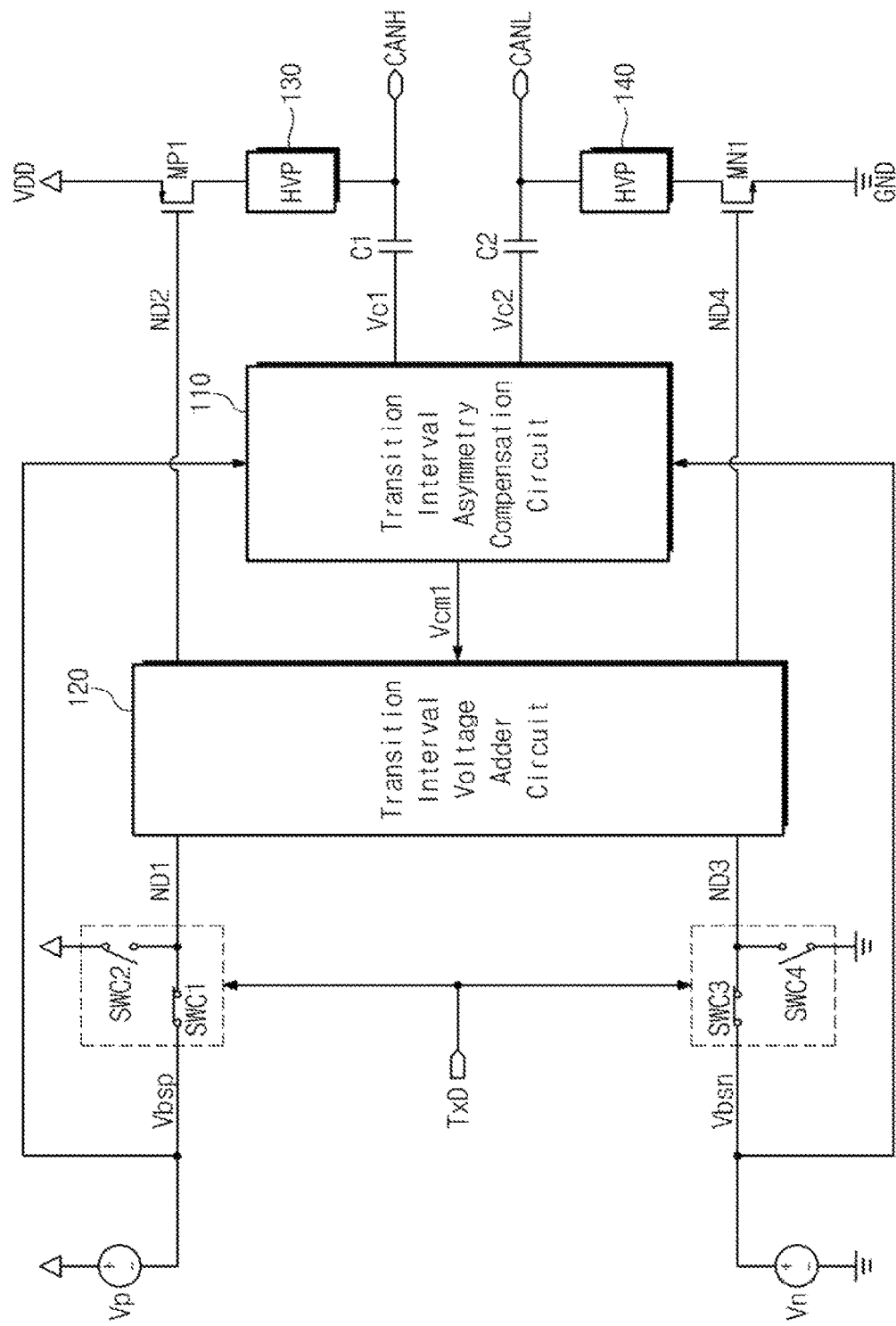
FIG. 2 is a circuit diagram illustrating a differential driving circuit according to another embodiment of the inventive concept.

FIG. 2 is a circuit diagram illustrating a differential driving circuit according to another embodiment of the inventive concept. The differential driving circuit 100 of FIG. 2 may compensate asymmetry characteristic between drivers in a transition interval. Referring to FIG. 2, the differential driving circuit 100 may include a first driving PMOS transistor MP1, a first driving NMOS transistor MN1, first and second coupling capacitors C1 and C2, a transition interval voltage adder circuit 110, a transition interval asymmetry compensation circuit 120, HVPs 130 and 140, high-side and low-side voltage sources Vp and Vn, and first to fourth control switches SWC1 to SWC4. Except for the first and second coupling capacitors C1 and C2, the transition interval voltage adder circuit 110, and the transition interval asymmetry compensation circuit 120, the configuration and the operation of the differential driving circuit 100 of FIG. 2 is the same as those of the differential driving circuit 10 of FIG. 1. Thus, the description regarding this will not be provided.

The first coupling capacitor C1 is connected between a node CANH and a node Vc1. The first coupling capacitor C1 transmits, to the node Vc1, only the component of transition interval voltage change from among voltage changes at the node CANH during the transition interval. The second coupling capacitor C2 is connected between a node CANL and a node Vc2. The second coupling capacitor C2 transmits, to the node Vc2, only the component of transition interval voltage change from among voltage changes at the node CANL at the transition interval.

The transition interval voltage adder circuit 110 is connected between the nodes Vc1 and Vc2, and a node Vcm1. The transition interval voltage adder circuit 110 adds voltages transmitted by the first and second coupling capacitors C1 and C2. The transition interval voltage adder circuit 110 may be connected with a node Vbsp and a node Vbsn, and may receive bias voltages of high-side and low-side voltage sources Vp and Vn. Detailed configuration and operation will be described with reference to FIGS. 4 and 5.

The first and second coupling capacitors C1 and C2 and the transition interval voltage adder circuit 110 monitor an asymmetry characteristic between drivers during the transition interval. For example, a case in which during the transition interval, the slew rate of the high-side driver is higher than the slew rate of the low-side driver is assumed. In this case, the voltage change of the node CANH is faster than that of the node CANL. Accordingly, the voltage transmitted through the first coupling capacitor C1 is not cancelled with the voltage transmitted through the second coupling capacitor C2. Subsequently, the voltage of the node Vcm1 added by the transition interval voltage adder circuit 110 is also increased. On the contrary, when the slew rate of the high-side driver is lower than the slew rate of the low-side driver, the voltage of the node Vcm1 added by the transition interval voltage adder circuit 110 is decreased.

The transition interval asymmetry compensation circuit 120 is connected between a first node ND1 and a second node ND2, and between a third node ND3 and a fourth node ND4. The transition interval asymmetry compensation circuit 120 adjusts a slope of a voltage signal transmitted through the first and third nodes ND1 and ND3 according to the voltage of the node Vcm1. For example, a case in which the slew rate of the high-side driver in the transition interval is higher than the slew rate of the low-side driver is assumed. In this case, the transition interval asymmetry compensation circuit 120 receives this asymmetry characteristic through a feedback, and decreases the slope of the voltage signal transmitted through the first node ND1 to thereby provide the voltage signal to the second node ND2. Then, the slew rate of the high-side driver is lowered, and thus the asymmetry of slew rates between the drivers is compensated. Alternatively, the transition interval asymmetry compensation circuit 120 increases the slope of the voltage signal transmitted through the third node ND3, so that the asymmetry of slew rates between drivers may be compensated.

For example, the transition interval asymmetry compensation circuit 120 may be configured such that both the slopes of the voltage signals of the first and third nodes ND1 and ND3 are compensated. In another example, the transition interval asymmetry compensation circuit 120 may be configured to compensate only the slope of the voltage signal of the first node ND1. Alternatively, the transition interval asymmetry compensation circuit 120 may be configured to compensate only the slope of the voltage signal of the third node ND3.

Figure 3:
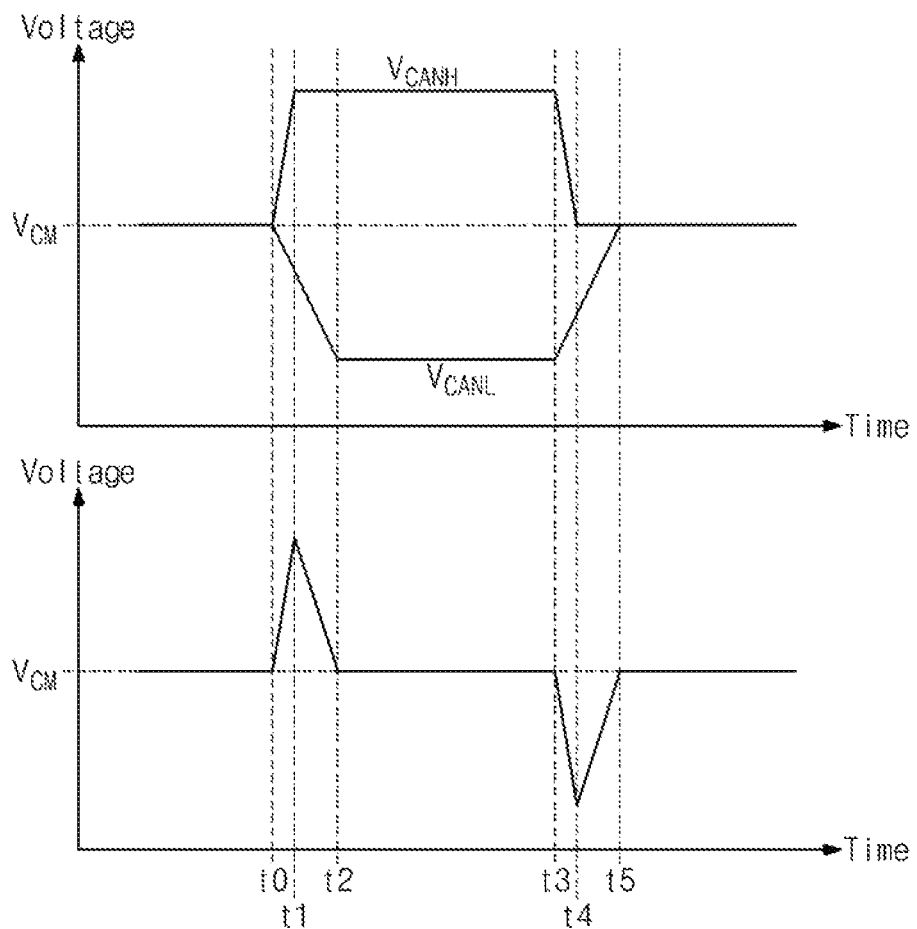
FIG. 3 is a timing diagram illustrating a common mode voltage change according to transition interval asymmetry of the differential driving circuit illustrated in FIG. 2.

FIG. 3 is a timing diagram illustrating a common mode voltage change according to transition interval asymmetry of the differential driving circuit illustrated in FIG. 2. FIG. 3 illustrates the voltage changes of the nodes CANH and CANL, and will be described with reference to the differential driving circuit 100 of FIG. 2. Here, a voltage Vcanh is the voltage of the node CANH. A voltage Vcanl is the voltage of the node CANL. Referring to FIG. 3, an interval t0-t2 and an interval t3-t5 become the above-mentioned transition interval. A load resistor (not shown) may be additionally connected to the outside of the differential driving circuit 100.

During an interval t0-t1, the first driving PMOS and NMOS transistors MP1 and MN1 are turned on to thereby supply current to the load resistor (not shown). In this case, to drive the first driving PMOS and NMOS transistors MP1 and MN1, voltage signals are supplied to the second and fourth nodes ND2 and ND4. However, due to the property asymmetry or the like between the high-side and low-side voltage sources Vp and Vn or between first and third control switches SWC1 and SWC3, the slopes of the voltage signals provided to the second and fourth nodes ND2 and ND4 may be different from each other. When the slope of the voltage signal of the second node ND2 is greater than that of the fourth node ND4, the slew rate of the high-side driver becomes greater than that of the low-side driver. FIG. 3 illustrates the above-mentioned example. Thus, the voltage Vcanh of the node CANH completes a voltage change at time t1. On the contrary, the voltage Vcanl of the node CANL cannot complete a voltage change at time t1.

In an interval t1-t2, only the first driving NMOS transistor MN1 is turned on to thereby supply current to the load resistor (not shown). Thus, the node CANL completes the voltage change at time t2. Consequently, a voltage Vcm has a voltage change in the interval t0-t2. In the present disclosure, the voltage Vcm is a common mode voltage and defined as a mean voltage level of the voltages Vcanh and Vcanl. That is, the voltage changes of the nodes CANH and CANL asymmetrically occur. In this case, the transition interval voltage adder circuit 110 and the transition interval asymmetry compensation circuit 120 detect the above-mentioned asymmetry of the slew rates in real time in the interval t0-t2. Subsequently, the transition interval voltage adder circuit 110 and the transition interval asymmetry compensation circuit 120 compensate the detected asymmetry of the slew rates. In the above-mentioned example, the transition interval asymmetry compensation circuit 120 decreases the slew rate of the high-side driver and increases the slew rate of the low-side driver in the interval t0-t2.

In an interval t3-t4, the first driving PMOS and NMOS transistors MP1 and MN1 are turned off to thereby decrease the current supplied to the load resistor (not shown). In this case, the first and second power supply voltages VDD and GND are respectively provided to the second and fourth nodes ND2 and ND4. However, due to the above-mentioned causes, the slopes of the voltage signals respectively provided to the second and fourth nodes ND2 and ND4 may be different from each other. Accordingly, as in the interval t1-t2, the voltage changes of the nodes CANH and CANL are completed at different timings.

In an interval t4-t5, only the first driving NMOS transistor MN1 is turned on to thereby supply current to the load resistor (not shown). Thus, the node CANL completes a voltage change at time t5. Consequently, the voltage Vcm has a voltage change in an interval t3-t5. Accordingly, as described above, the transition interval asymmetry compensation circuit 120 decreases the slew rate of the high-side driver and increases the slew rate of the low-side driver in the interval t4-t5. Consequently, the differential driving circuit 100 compensates the asymmetry of the slew-rate in the transition interval in real time.

Figure 4:
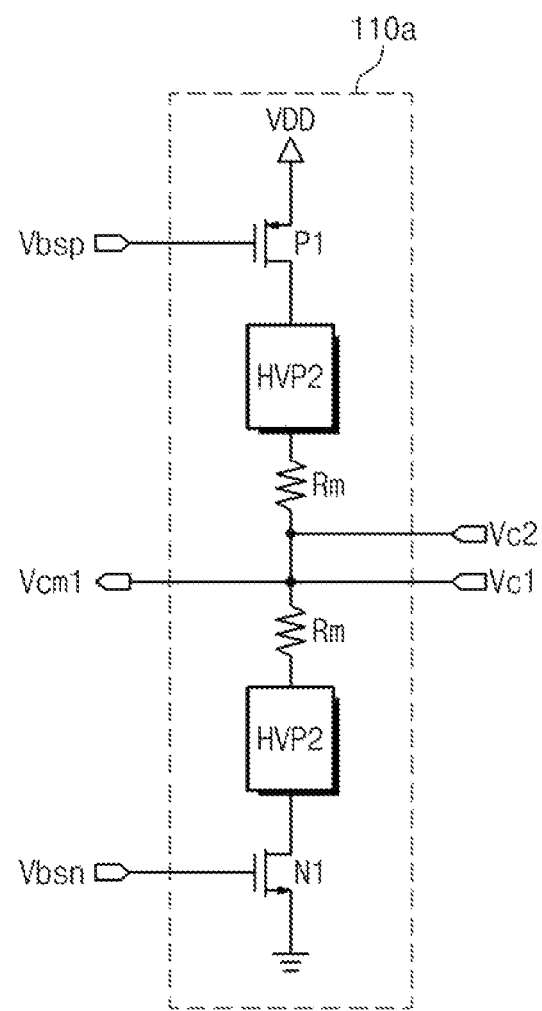
FIGS. 4 and 5 are circuit diagrams exemplarily illustrating a transition interval voltage adder circuit illustrated in FIG. 2.
Figure 5:
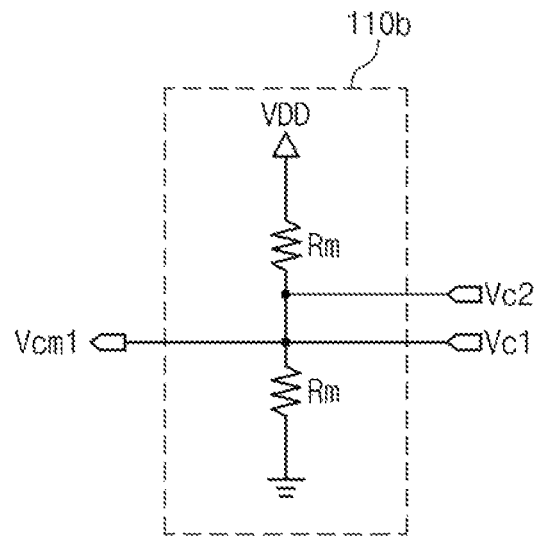

FIGS. 4 and 5 are circuit diagrams exemplarily illustrating the transition interval voltage adder circuit illustrated in FIG. 2.

Referring to FIG. 4, the transition interval voltage adder circuit 110a may include a first PMOS transistor P1, a first NMOS transistor N1, a plurality of high-voltage prevention circuits HVP2, and a plurality of modeling resistors Rm. The first PMOS transistor P1, HVP2, and the modeling resistor Rm are connected in series between a first power supply voltage VDD and a node Vcm1. The first NMOS transistor N1, HVP2, and the modeling resistor Rm are connected in series between a second power supply voltage GND and the node Vcm1. In FIGS. 2 and 4, for convenience of description, nodes Vc1 and Vc2 are illustrated separately from the node Vcm1. However, the above-mentioned nodes Vc1, Vc2 and Vcm1 may be actually configured as the same node as in FIG. 4.

The transition interval voltage adder circuit 110a may be configured to have the same size as the high-side driver and the low-side driver illustrated in FIG. 2. In this case, the modeling resistor Rm may have a resistance value of ½ of that of a load resistor (not shown). Alternatively, to reduce power consumption, the transition interval voltage adder circuit 110a may be configured by scaling down the high-side driver and the low-side driver of FIG. 2 to 1/K size. In this case, the first PMOS and NOMS transistors P1 and N1 have the sizes of 1/K times the sizes of the first driving PMOS and NOMS transistors MP1 and MN1. HVP2 is configured to have a size of 1/K times the size of HVP. The resistance value of the modeling resistor Rm is configured to have ½ of a value which is K times the resistance value of the load resistors (not shown).

The transition interval voltage adder circuit 110a receives high-side and low-side bias voltages respectively through nodes Vbsp and Vbsn. Accordingly, the transition interval voltage adder circuit 110a operates in the same way as in the dominant state (steady-state interval) between the high-side driver and the low-side driver of FIG. 2. That is, the voltage of the node Vcm1 in the transition interval voltage adder circuit 110a is the same as the common mode voltage in the dominant state. Also, the transition interval voltage adder circuit 110a receives the voltage change of the high-side driver and the low-side driver through the nodes Vc1 and Vc2. Subsequently, this voltage and the common mode voltage formed by the transition interval voltage adder circuit 110a are added and thereby provided to the node Vcm1. Thus, the transition interval voltage adder circuit 110a may monitor asymmetry characteristic between the drivers both in the transition interval and in the steady-state interval.

Referring to FIG. 5, the transition interval voltage adder circuit 110b may include a plurality of modeling resistors Rm. Two modeling resistors Rm are respectively connected between a first power supply voltage VDD and a node Vcm1, and between the node Vcm1 and a second power supply voltage GND. The transition interval voltage adder circuit 110b of FIG. 5 does not receive a bias voltage from high-side and low-side voltage sources Vp and Vn unlike the transition interval voltage adder circuit 110a of FIG. 4. Excepting that only the asymmetry characteristic between the drivers in the above-mentioned interval can be monitored, the transition interval voltage adder circuit 110b of FIG. 5 has the same function as the transition interval voltage adder circuit 110a of FIG. 4. As described in detail in FIG. 4, the nodes Vc1, Vc2, and Vcm1 of FIG. 5 are the same nodes.

Figure 6:
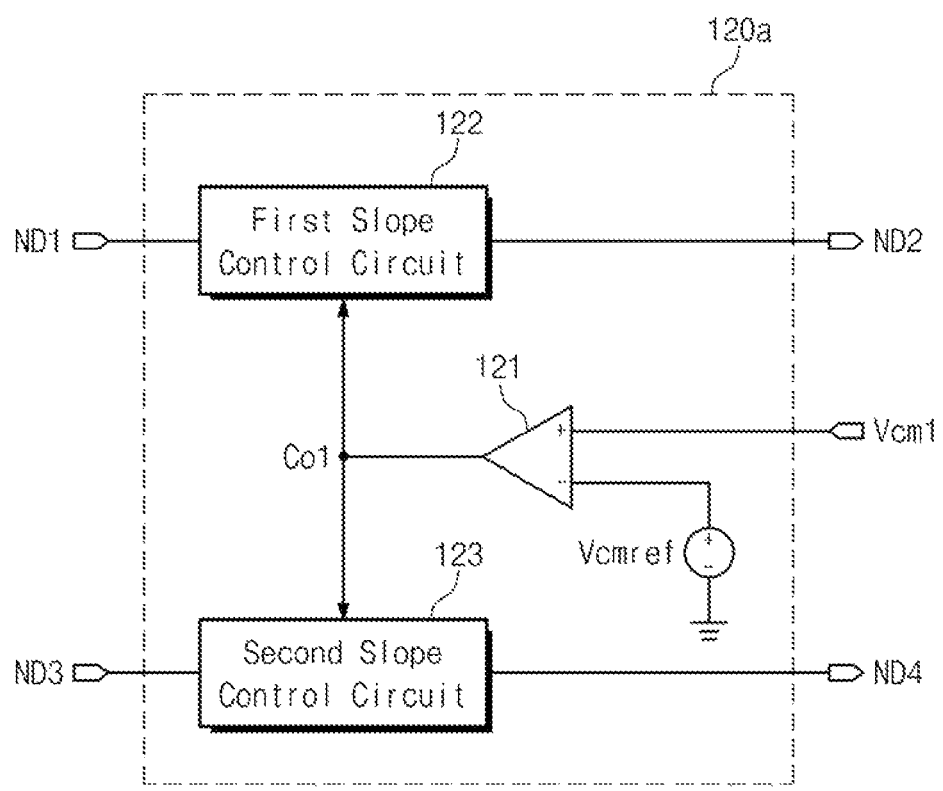
FIGS. 6 to 8 are block diagrams exemplarily illustrating a transition interval asymmetry compensation circuit illustrated in FIG. 2.
Figure 7:
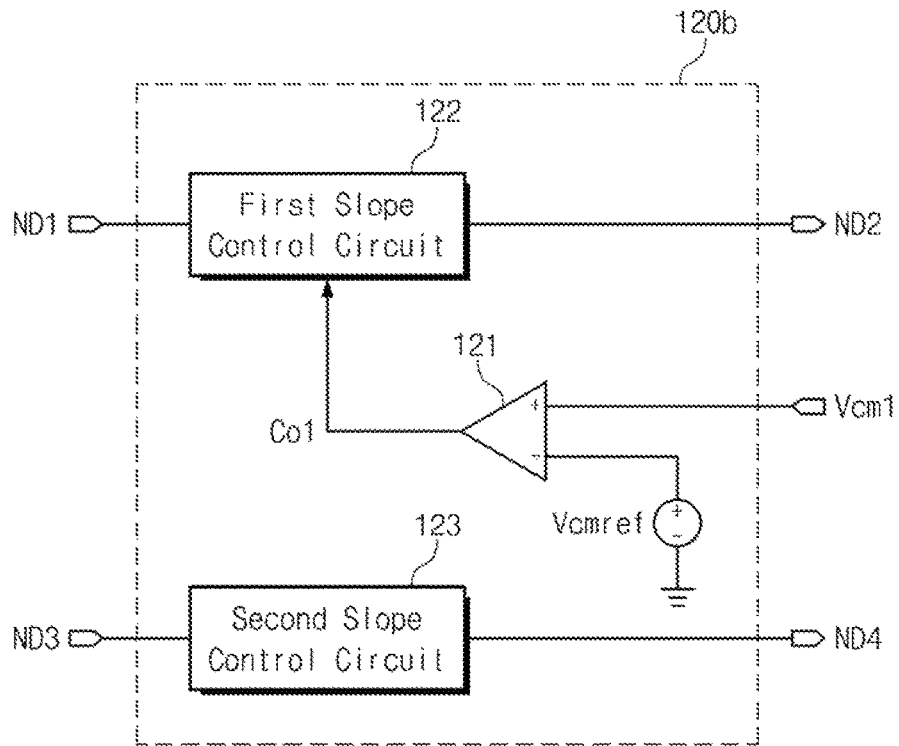
Figure 8:
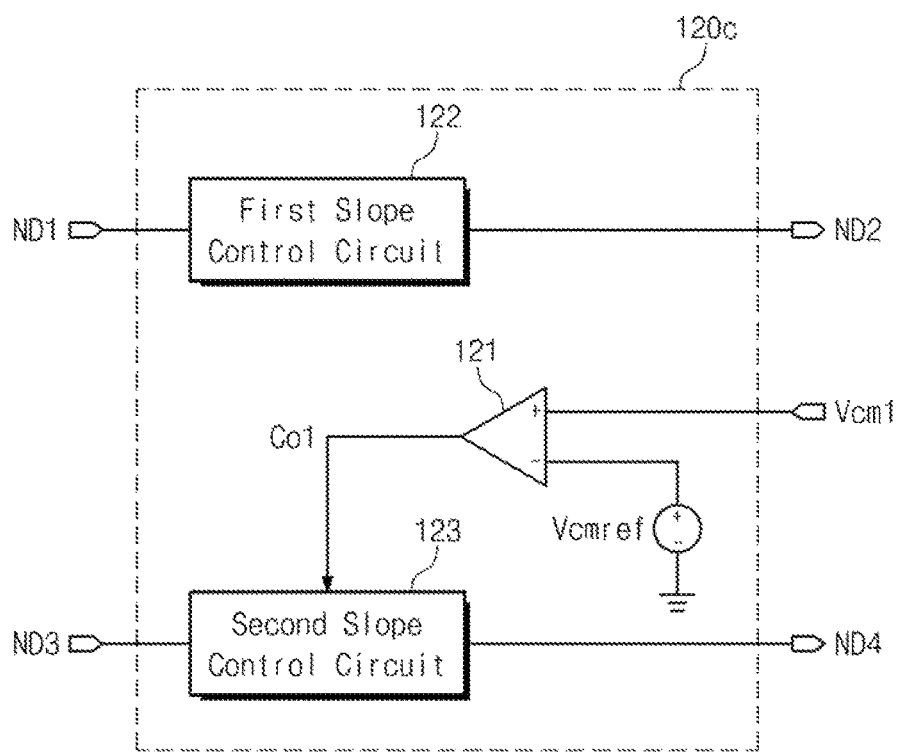

FIGS. 6 to 8 are block diagrams exemplarily illustrating a transition interval asymmetry compensation circuit illustrated in FIG. 2.

Referring to FIG. 6, a transition interval asymmetry compensation circuit 120a may include a comparator 121, a reference voltage source Vcmref, and first and second slope control circuits 122 and 123.

The comparator 121 is connected to the reference voltage source Vcmref, the first slope control circuit 122, and the second slope control circuit 123. The comparator 121 compares the voltage of a node Vcm1 with the reference voltage source Vcmref to thereby output the voltage difference to a node Co1. The first slope control circuit 122 is connected between the first node ND1 and a second node ND2. The first slope control circuit 122 is controlled by the output signal of the comparator which is supplied to the node Co1, and adjusts the slope of a voltage signal inputted through the first node ND1 to transmit the voltage signal to the second node ND2. The second slope control circuit 123 is connected between a third node ND3 and a fourth node ND4. The second slope control circuit 123 is controlled by the output signal of the comparator 121 which is supplied to the node Co1, and adjusts the slope of a voltage signal inputted through the third node ND3 to transmit the voltage signal to the fourth node ND4.

The operation of the transition interval asymmetric compensation circuit 120a is as follows, and will be described with reference to the differential driving circuit 100 of FIG. 2. First, the output voltage of the transition interval voltage adder circuit 110 is supplied to the comparator 121 through the node Vcm1. This voltage is a voltage in which the asymmetric characteristic between drivers during the transition interval is reflected. The comparator 121 compares the supplied voltage with the voltage of the reference voltage source Vcmref. The comparator 121 amplifies the difference of two voltages to output to the node Co1. That is, the voltage of the node Co1 is a voltage in which the asymmetric characteristic between drivers during the transition interval is reflected. The first and second slope control circuits 122 and 123 adjusts the slope of the voltage signals inputted to the first and third nodes ND1 and ND3 according to the voltage of the node Co1.

For example, it is assumed that in the transition interval, the slew rate of the high-side driver is higher than the slew rate of the low-side driver. Subsequently, the voltage level of the node Vcm1 is increased higher than a reference voltage by the first and second coupling capacitors C1 and C2, and the transition voltage adder circuit 110. The comparator 121 compares the voltage of the node Vcm1 with the reference voltage source Vcmref to thereby output the result to the node Co1. According to the voltage change of the node Co1, the compensation values of the slopes of the first and second slope control circuits 122 and 123 are changed. That is, the first slope control circuit 122 decreases the slope of the voltage signal of the second node ND2 to decrease the slew rate of the high-side driver. The second slope control circuit 123 increases the slope of the voltage signal of the fourth node ND4 to increase the slew rate of the low-side driver. Consequently, the transition asymmetry compensation circuit 120 compensates such that the slew rates of the high-side driver and the low-side driver are matched.

Referring to FIG. 7, a transition interval asymmetry compensation circuit 120b may include a comparator 121, a reference voltage source Vcmref, and first and second slope control circuits 122 and 123. Except that the second slope control circuit 123 is not controlled by the voltage of a node Co1, the transition interval asymmetry compensation circuit 120b of FIG. 7 has the same configuration and operation as those of the transition interval asymmetry compensation circuit 120a of FIG. 6. Thus, the description regarding this will not be provided. That is, the transition interval asymmetry compensation circuit 120b of FIG. 7 compensates only the slew rate of the high-side driver to compensate the asymmetry of the slew rates between the drivers.

Referring to FIG. 8, a transition interval asymmetry compensation circuit 120c may include a comparator 121, a reference voltage source Vcmref, and first and second slope control circuits 122 and 123. Except that the first slope control circuit 122 is not controlled by the voltage of a node Co1, the transition interval asymmetry compensation circuit 120c of FIG. 8 has the same configuration and operation as those of the transition interval asymmetry compensation circuit 120a of FIG. 6. Thus, the description regarding this will not be provided. That is, the transition interval asymmetry compensation circuit 120c of FIG. 8 compensates only the slew rate of the low-side driver to compensate the asymmetry of the slew rates between the drivers.

Figure 9:
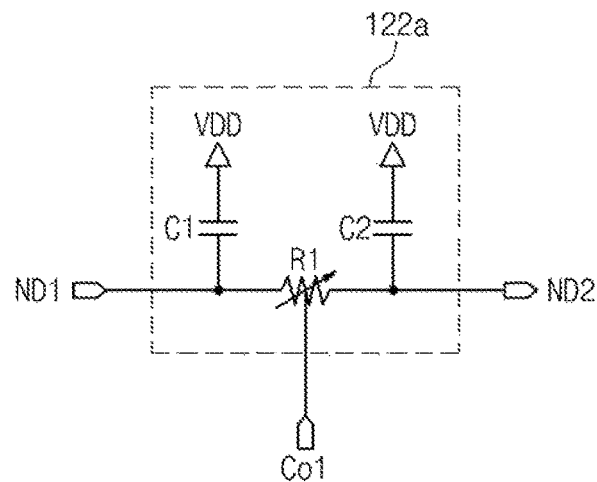
FIGS. 9 and 10 are circuit diagrams exemplarily illustrating a first slope control circuit illustrated in FIGS. 6 and 7.
Figure 10:
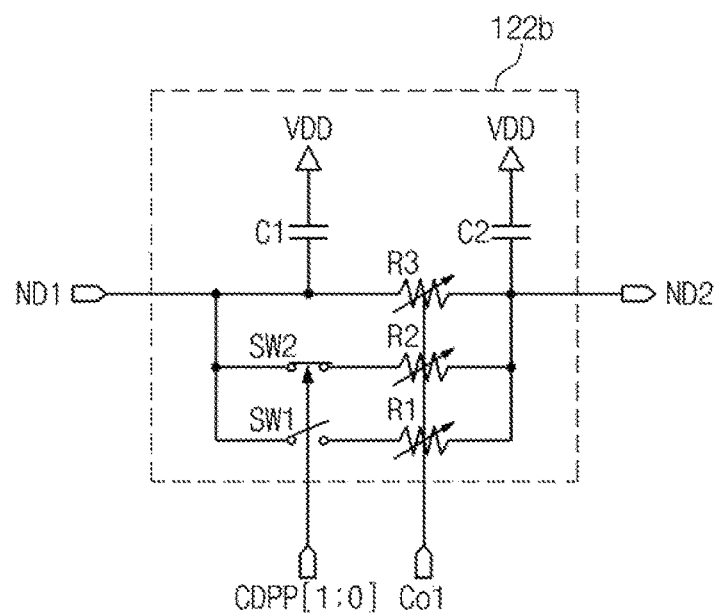

FIGS. 9 and 10 are circuit diagrams exemplarily illustrating the first slope control circuit illustrated in FIGS. 6 and 7.

Referring to FIG. 9, a first slope control circuit 122a may include first and second capacitors C1 and C2, and a variable resistor R1. The variable resistor R1 is connected between a first node ND1 and a second node ND2. The resistance value of the variable resistor R1 varies according to the voltage change of a node Co1. The first capacitor C1 is connected between the first node ND1 and the first power supply voltage VDD. The second capacitor C2 is connected between the second node ND2 and the first power supply voltage VDD.

An RC value of the second capacitor C2 and the variable resistor R1 adjusts the slope of the signal when the voltage signal of the second node ND2 is changed from a high level to a low level. For example, a case in which the second node ND2 is changed from a state of being discharged to a high voltage level into a low voltage level is assumed. The current generated in this case is transmitted from the first node ND1 to the second node ND2 through the variable resistor R1 and the second capacitor C2. Thus, the RC value of the path through which the current flows is determined by the value of the second capacitor C2 and the variable resistor R1. On the contrary, the slope of the signal when the voltage signal of the second node ND2 is changed from a low level to a high level is determined by the RC value of the first capacitor C1 and the variable resistor R1. Thus, when the slew rate of the high-side driver is greater than the slew rate of the low-side driver, the resistance value of the variable resistor R1 is adjusted to be increased. This is for the purpose of decreasing the slope of the voltage signal of the second node ND2 which drives the high-side driver. That is, the RC value of the path, through which the current flowing from the first node ND1 to the second node ND2 flows, is increased and the slope of the voltage signal of the second node ND2 is thereby decreased. Consequently, the slew rate of the high-side driver is decreased. By the same reason, the resistance value of the variable resistor R1 is adjusted to be decreased in the opposite case.

Referring to FIG. 10, the slope control circuit 122b may include first and second capacitors C1 and C2, first to third variable resistors R1 to R3, and first and second switches SW1 and SW2. The first switch SW1 is connected to the first variable resistor R1 in series. The first switch SW1 and the first variable resistor R1 are connected between first and second nodes ND1 and ND2. The second switch SW2 is connected to the second variable resistor R2 in series. The second switch SW2 and the second variable resistor R2 are connected between the first and second nodes ND1 and ND2. The third variable resistor R3 is connected between the first and second nodes ND1 and ND2. The resistance values of the first to third variable resistors R1 to R3 can be changed according to the voltage of the a node Co1. The first capacitor C1 is connected between the first node ND1 and the first power supply voltage VDD. The second capacitor C2 is connected between the second node ND2 and the first power supply voltage VDD.

Except that the high-side resistance adjusting code CDPP [1:0] determines whether the first variable resistor R1 or the second variable resistor R2 is connected to node ND1, the slope control circuit 122b of FIG. 10 has the same configuration and operation as those of the first slope control circuit 122a of FIG. 9. That is, whether the first and second switches SW1 and SW2 are opened or closed is changed according to the high-side resistance adjusting code CDPP [1:0]. Also, accordingly, combination and equivalent resistance values of the first to third variable resistors R1 to R3, which are adjusted by the voltage of the node Co1, are changed. Although not shown, the high-side resistance adjusting code CDPP[1:0] may be provided through a host or an external device. In FIG. 10, only two switches SW1 and SW2 and only two variable resistors R1 and R2 are exemplarily illustrated, but each thereof may be configured from two or more elements.

Figure 11:
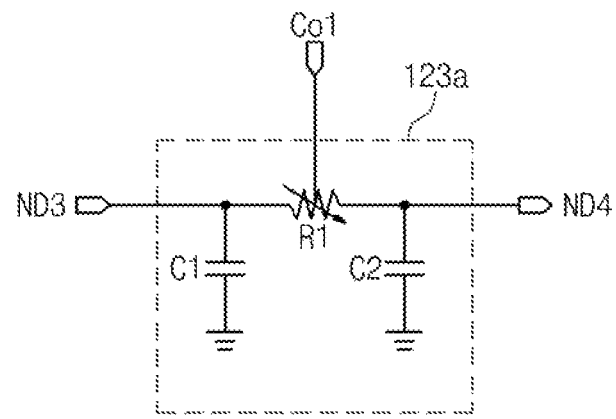
FIGS. 11 and 12 are circuit diagrams exemplarily illustrating a second slope control circuit illustrated in FIGS. 6 and 8.
Figure 12:
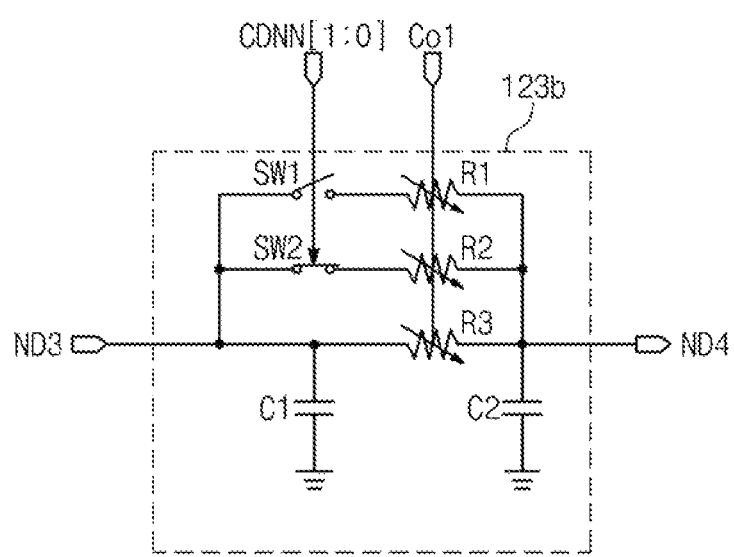

FIGS. 11 and 12 are circuit diagrams exemplarily illustrating a second slope control circuit illustrated in FIGS. 6 and 8.

Referring to FIG. 11, a second slope control circuit 123a may include first and second capacitors C1 and C2, and a variable resistor R1. The variable resistor R1 is connected between a third node ND3 and a fourth node ND4. The resistance value of the variable resistor R1 can be changed according to the voltage of a node Co1. The first capacitor C1 is connected between the third node ND3 and the second power supply voltage GND. The second capacitor C2 is connected between the fourth node ND4 and the second power supply voltage GND.

The second slope control circuit 123a adjusts the slope of the voltage signal of the fourth node ND4 in order to adjust the slew rate of a low-side driver according to the voltage change of a node Co1. Except for the above-mentioned features, the second slope control circuit 123a of FIG. 11 has the same configuration and operation as those of the first slope control circuit 122a of FIG. 9. Thus, the description regarding this will not be provided.

Referring to FIG. 12, the second slope control circuit 123b may include first and second capacitors C1 and C2, first to third variable resistors R1 to R3, and first and second switches SW1 and SW2. The first switch SW1 is connected to the first variable resistor R1 in series. The first switch SW1 and the first variable resistor R1 are connected between third and fourth nodes ND3 and ND4. The second switch SW2 is connected to the second variable resistor R2 in series. The second switch SW2 and the second variable resistor R2 are connected between the third and fourth nodes ND3 and ND4. The third variable resistor R3 is connected between the third and fourth nodes ND3 and ND4. The resistance values of the first to third variable resistors R1 to R3 can be changed according to the voltage of the a node Co1. The first capacitor C1 is connected between the third node ND3 and the second power supply voltage GND. The second capacitor C2 is connected between the fourth node ND4 and the second power supply voltage GND.

The second slope control circuit 123b of FIG. 12 adjusts the slope of the signal of the fourth node ND4 to compensate the asymmetry of the slew rates between drivers. Also, the second slope control circuit 123b has variable resistors R1 and R2 connected thereto. And low-side resistance adjusting code CDNN [1:0] determines whether the first variable resistor R1 or the second variable resistor R2 is connected. Although not shown, the low-side resistance adjusting code CDNN[1:0] may be provided through a host or an external device. Except for the above-mentioned features, the second slope control circuit 123b of FIG. 12 has the same configuration and operation as those of the first slope control circuit 122b of FIG. 10. Thus, the description regarding this will not be provided.

Figure 13:
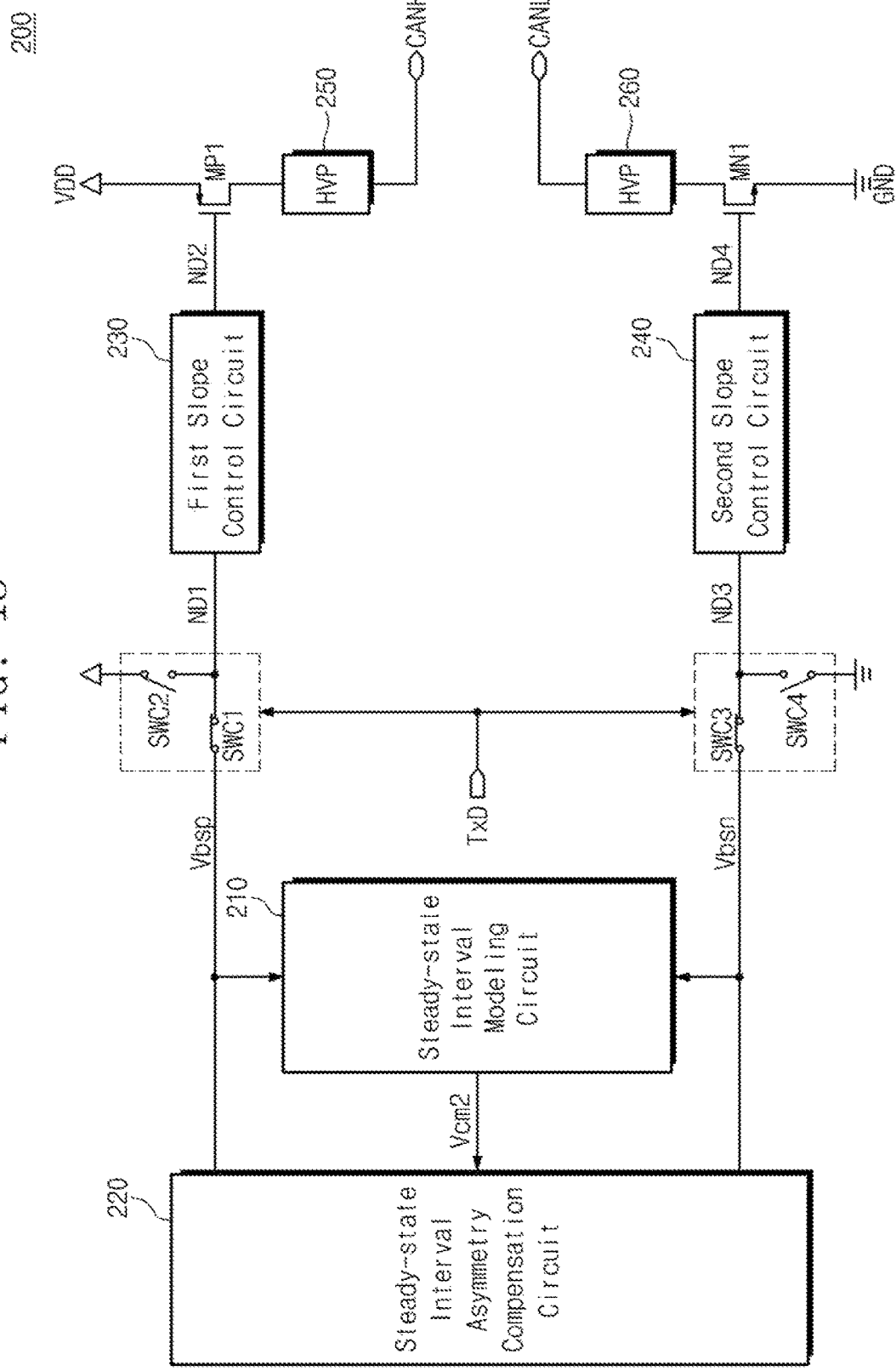
FIG. 13 is a circuit diagram illustrating a differential driving circuit according to another embodiment of the inventive concept.

FIG. 13 is a circuit diagram illustrating a differential driving circuit according to another embodiment of the inventive concept. The differential driving circuit 200 of FIG. 13 may compensate asymmetry characteristic between drivers in a steady-state interval. Referring to FIG. 13, a differential driving circuit 200 may include a first driving PMOS transistor MP1, a first driving NMOS transistor MN1, a steady-state interval modeling circuit 210, a steady-state interval asymmetry compensation circuit 220, first and second slope control circuits 230 and 240, HVPs 250 and 260, high-side and low-side voltage sources Vp and Vn, and first to fourth control switches SWC1 to SWC4. Except for the steady-state interval modeling circuit 210 and the steady-state interval asymmetry compensation circuit 220, the fundamental configuration and the operation of the differential driving circuit 200 of FIG. 13 is the same as those of the differential driving circuit 10 of FIG. 1. Thus, the description related to this will not be provided.

The steady-state interval modeling circuit 210 is connected between a node Vbsp and a node Vbsn, and outputs a voltage to a node Vcm2. The steady-state interval modeling circuit 210 receives high-side and low-side bias voltages, which are generated from the steady-state asymmetry compensation circuit 220, through the nodes Vbsp and Vbsn. The steady-state interval modeling circuit 210, which models the high-side and low-side drivers, monitors the asymmetry characteristics between drivers in the steady-state interval.

The steady-state asymmetry compensation circuit 220 receives a voltage through a node Vcm2, and supplies high-side and low-side bias voltages respectively to the nodes Vbsp and Vbsn. That is, in order to compensate the asymmetry between the drivers in the steady-state interval, the asymmetry being monitored through the steady-state interval modeling circuit 210, the steady-state interval asymmetry compensation circuit 220 adjusts the high-side and low-side bias voltages to output to the nodes Vbsn and Vbsn. The detailed configuration and operation of the steady-state interval asymmetry compensation circuit 220 will be described with reference to FIGS. 16 to 18.

Figure 14:
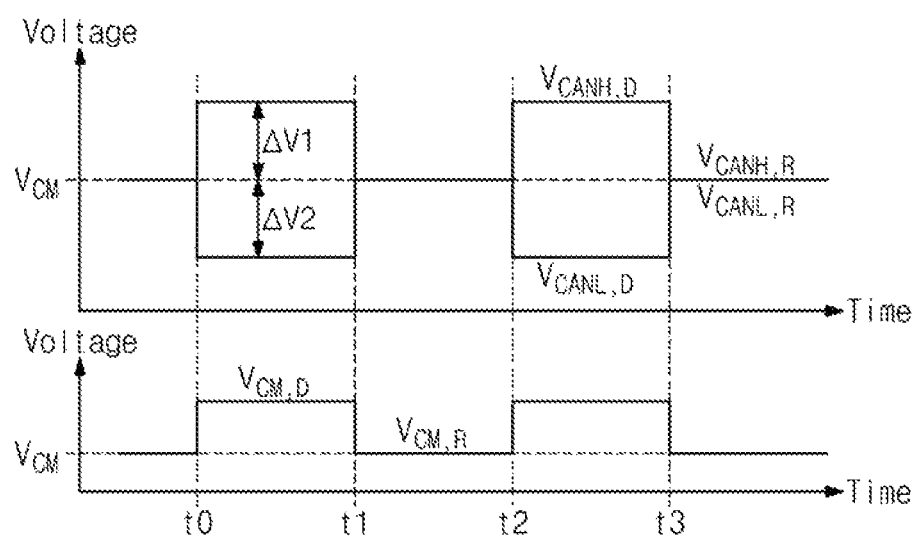
FIG. 14 is a timing diagram illustrating a common mode voltage change according to steady-state interval asymmetry of the differential driving circuit illustrated in FIG. 13.

FIG. 14 is a timing diagram illustrating a common mode voltage change according to steady-state interval asymmetry of the differential driving circuit illustrated in FIG. 13. FIG. 14 illustrates the voltage changes of the nodes CANH and CANL, and will be described with reference to the differential driving circuit 200 of FIG. 13. Referring to FIG. 14, an interval t0-t1 and an interval t2-t3 become the above-mentioned transition intervals. The definitions of terms illustrated in FIG. 14 are as follows. A voltage Vcanh,d is the voltage of a node CANH in the dominant state, and a voltage Vcanl,d is the voltage of a node CANL in the dominant state. A voltage Vcanh,r is the voltage of the node CANH in the recessive state, and a voltage Vcanl,r is the voltage of the node CANL in the recessive state. A voltage Vcm,d is a common mode voltage in the dominant state, and a voltage Vcm,r is a common mode voltage in the recessive state. A voltage difference V1 is the difference between the voltage Vcanh,d and the voltage Vcm, and a voltage difference V2 is the difference between the voltage Vcanl,d and the voltage Vcm.

In the interval t0-t1, the differential driving circuit 200 is maintained at the dominant state. In this case, asymmetry may be occurred between the amounts of driving currents of the first driving PMOS transistor MP1 and the first driving NMOS transistor NM1. This may be caused by the asymmetry in sizes of the first driving PMOS and NMOS transistors MP1 and NM1, or the like. Alternatively, this may be caused by the asymmetry in high-side and low-side bias voltage levels which drive the first driving PMOS and NMOS transistors MP1 and NM1, or the like. In the example of FIG. 14, when the amount of driving current of the high-side driver is greater than that of the low-side driver, the voltage difference V1 becomes greater than the voltage difference V2. In this case, the steady-state interval modeling circuit 210 detects the asymmetry of the amounts of driving currents of the high-side and low-side drivers. Subsequently, the steady-state interval asymmetry compensation circuit 220 compensates the asymmetry of the detected amounts of driving currents. That is, in an interval t0-t1, the steady-state interval asymmetry compensation circuit 220 decreases the amount of the driving current of the high-side driver, and increases the amount of the driving current of the low-side driver.

In an interval t1-t2, the differential driving circuit 200 is maintained at the recessive state. A common mode voltage Vcm,r in this interval has a voltage value formed at the input end of a separate CAN bus receiving circuit from the differential driving circuit. In general, this value has the same value as Vcmref of FIG. 16.

In an interval t2-t3, the differential driving circuit 200 is maintained at the dominant state. In this time interval, the same operations as that in the interval t0-t1 are performed. In the interval t2-t3, the steady-state interval asymmetry compensation circuit 220 decreases the amount of the driving current of the high-side driver, and increases the amount of the driving current of the low-side driver.

Figure 15:
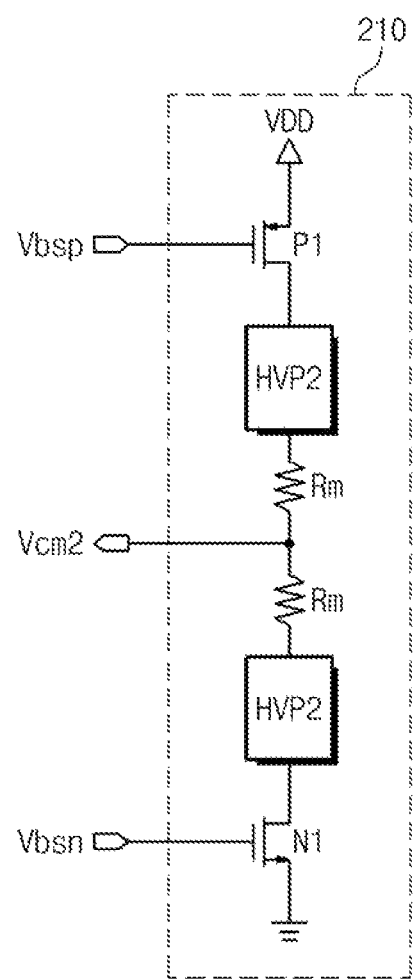
FIG. 15 is a circuit diagram exemplarily illustrating a steady-state interval modeling circuit illustrated in FIG. 13.

FIG. 15 is a circuit diagram exemplarily illustrating a steady-state interval modeling circuit illustrated in FIG. 13. The steady-state interval modeling circuit 210 monitors only the asymmetry characteristic in the steady-state interval, and does not therefore receive feedback of the voltage change from nodes CANH and CANL. Except for the above-mentioned features, the steady-state interval modeling circuit 210 has the same configuration and operation as those of the transition interval voltage adder circuit 110a of FIG. 4. Thus, the description regarding this will not be provided.

Figure 16:
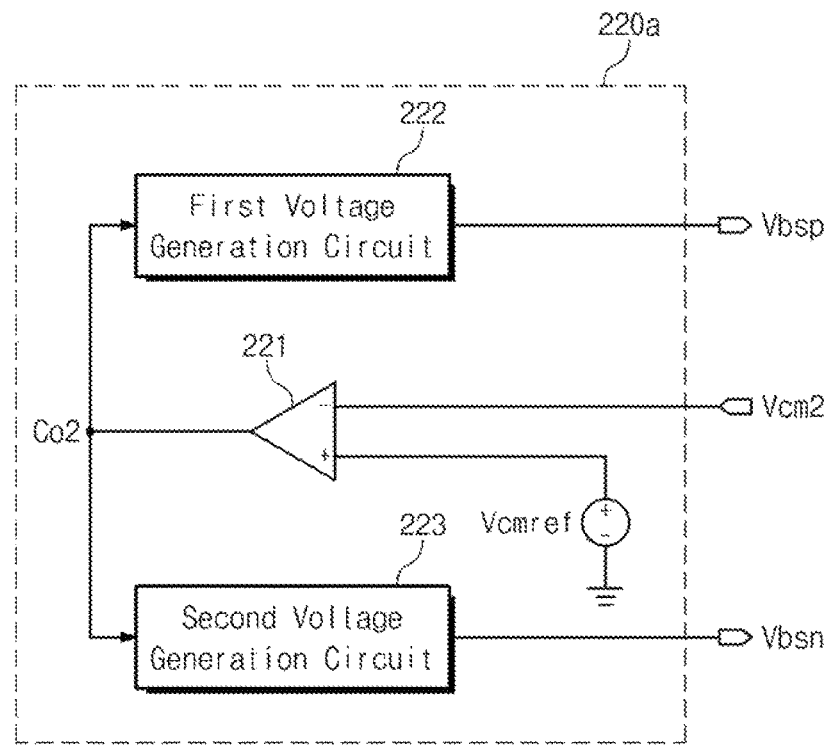
FIGS. 16 to 18 are block diagrams exemplarily illustrating a steady-state interval asymmetry compensation circuit illustrated in FIG. 13.
Figure 17:
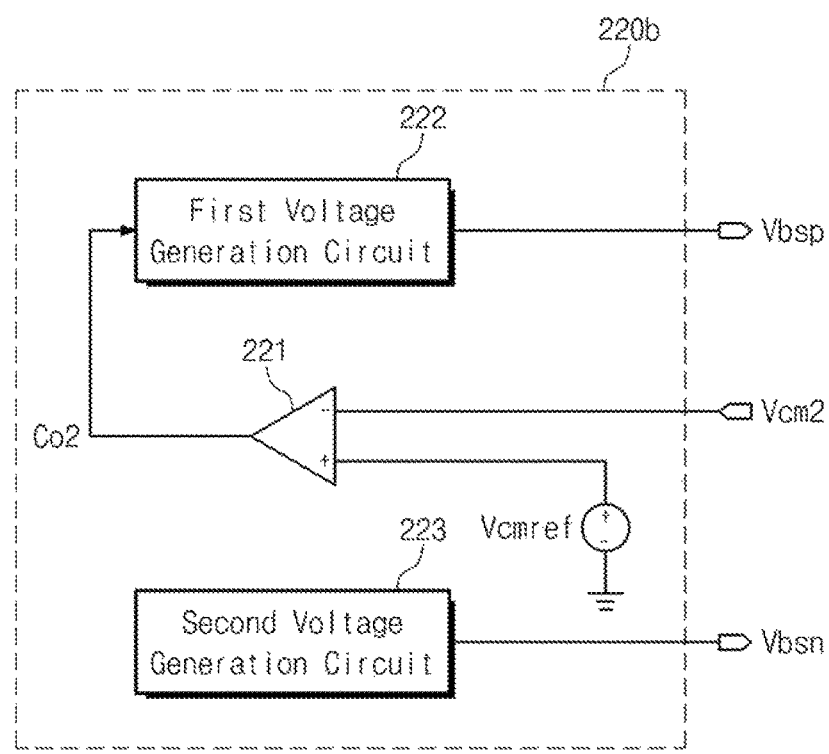
Figure 18:
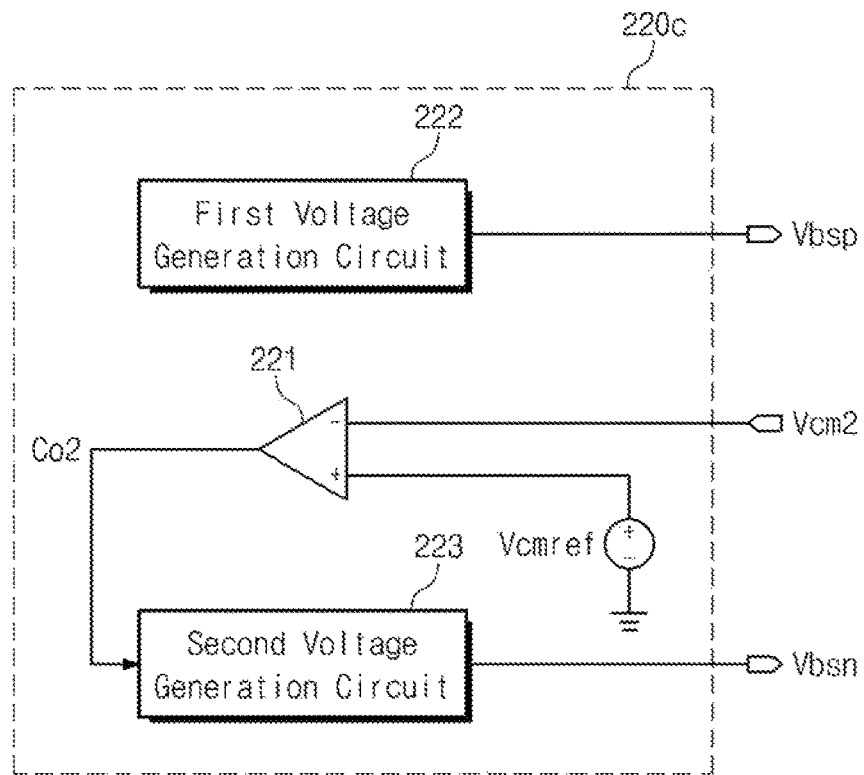

FIGS. 16 to 18 are block diagrams exemplarily illustrating a steady-state interval asymmetry compensation circuit illustrated in FIG. 13.

Referring to FIG. 16, a transition interval asymmetry compensation circuit 220a may include a comparator 221, a reference voltage source Vcmref, and first and second voltage generation circuits 222 and 223. The comparator 121 receives the voltage of a node Vcm2 at a negative input terminal thereof, and compares the voltage with the voltage of the reference voltage source Vcmref to thereby output the voltage difference to a node Co2. The first voltage generation circuit 222 is connected between the node Co2 and a node Vbsp. The first voltage generation circuit 222 is controlled by the output signal of the comparator 221 which is supplied to the node Co2, and adjusts the level of a high-side bias voltage to supply the voltage to the node Vbsp. The second voltage generation circuit 223 is connected between the node Co2 and the node Vbsn. The second voltage generation circuit 223 is controlled by the output signal of the comparator 221 which is supplied to the node Co2, and adjusts the level of a low-side bias voltage to supply the voltage to the node Vbsn.

The operation of the steady-state interval asymmetric compensation circuit 220a is as follows, and will be described with reference to the differential driving circuit 200 of FIG. 13. First, the output of the steady-state interval modeling circuit 210 is supplied to the negative input terminal of the comparator 221 through the node Vcm2. The comparator 221 compares the supplied voltage with the voltage of the reference voltage source Vcmref. The comparator 221 amplifies the difference of the voltages to output the inverted result to the node Co2. That is, the voltage of the node Co2 is a voltage in which the asymmetric characteristic between the drivers in the steady-state interval is reflected. The first and second voltage generation circuits 222 and 223 adjust the levels of the high-side and low-side bias voltages such that the asymmetry between the amounts of driving current of drivers is compensated.

For example, a case in which the amount of the driving current of the high-side driver in the above-mentioned steady-state interval is greater than that of the low-side driver is assumed. That is, this is the case in which the level of the high-side bias voltage is excessively low. Subsequently, the voltage of the output of the steady-state interval modeling circuit 210 is increased. The increased output voltage is supplied to the comparator 221 through the node Vcm2. The comparator 221 compares the voltage of the node Vcm2 with the voltage of the reference voltage source Vcmref to thereby output the result to the node Co2. In this case, the voltage level of the node Co2 will be decreased. Subsequently, the first voltage generation circuit 222 increases the level of the high-side bias voltage by the voltage change of the node Co2 to output the high-side bias voltage to the node Vbsp. Also, the second voltage generation circuit 223 increases the low-side bias voltage level by the voltage change of the node Co2 to output the low-side bias voltage to the node Vbsn. The amounts of driving currents of the high-side and low-side drivers are changed by the changed bias voltage level. Consequently, the amounts of the driving currents of the first driving PMOS transistor MP1 of the high-side driver and the first driving NMOS transistor MN1 of the low-side driver are matched.

Referring to FIG. 17, a steady-state interval asymmetry compensation circuit 220b may include a comparator 221, a reference voltage source Vcmref, and first and second voltage generation circuits 222 and 223. Except that the voltage generation circuit 223 is not controlled by the voltage of a node Co2, the steady-state interval asymmetry compensation circuit 220b of FIG. 17 has the same configuration and operation as those of the steady-state interval asymmetry compensation circuit 220a of FIG. 16. Thus, the description regarding this will not be provided. That is, the steady-state interval asymmetry compensation circuit 220b of FIG. 17 compensates only the amount of driving current of the high-side driver to compensate the asymmetry between the amounts of the driving currents of the drivers.

Referring to FIG. 18, a steady-state interval asymmetry compensation circuit 220c may include a comparator 221, a reference voltage source Vcmref, and first and second voltage generation circuits 222 and 223. Except that the voltage generation circuit 222 is not controlled by the voltage of a node Co2, the steady-state interval asymmetry compensation circuit 220c of FIG. 18 has the same configuration and operation as those of the steady-state interval asymmetry compensation circuit 220a of FIG. 16. Thus, the description regarding this will not be provided. That is, the steady-state interval asymmetry compensation circuit 220c of FIG. 18 compensates only the amount of driving current of the low-side driver to compensate the asymmetry between the amounts of the driving currents of the drivers.

Figure 19:
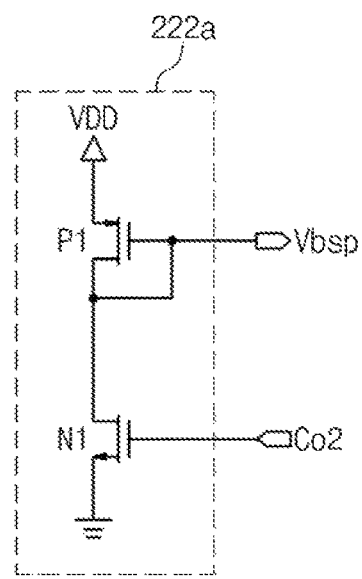
FIGS. 19 and 20 are circuit diagrams exemplarily illustrating a first voltage generation circuit illustrated in FIGS. 16 and 17.
Figure 20:
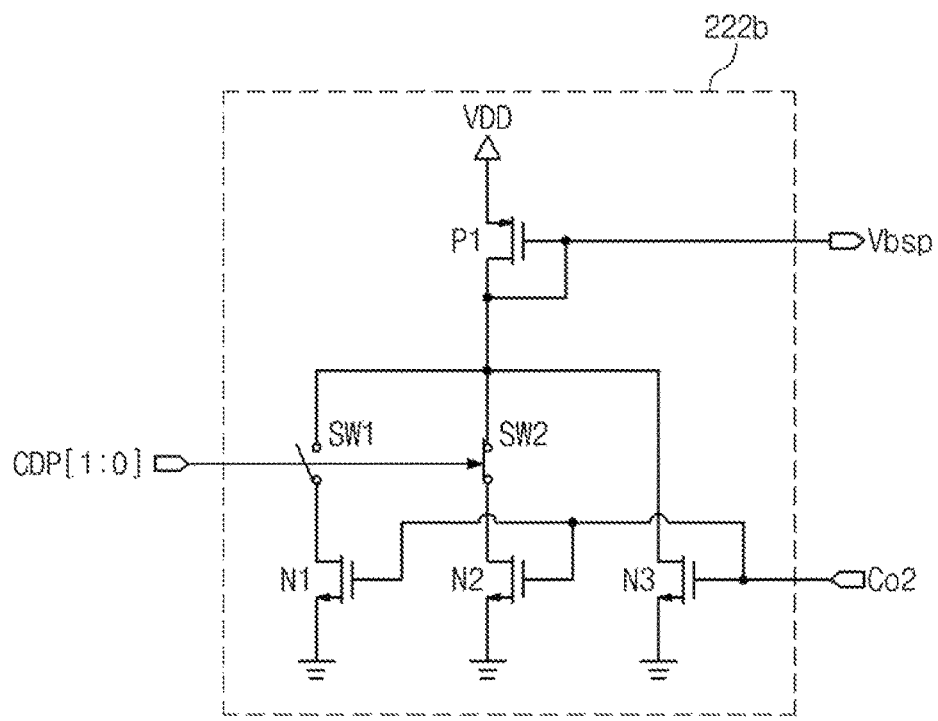

FIGS. 19 and 20 are circuit diagrams exemplarily illustrating a first voltage generation circuit illustrated in FIGS. 16 and 17.

Referring to FIG. 19, a first voltage generation circuit 222a may include a first PMOS transistor P1 and a first NMOS transistor N1. The source of the first PMOS transistor P1 is connected to a first power supply voltage VDD. The gate and the drain of the first PMOS transistor P1 are connected to each other and connected to a node Vbsp. The source of a first NMOS transistor N1 is connected to a second power supply voltage GND. The drain of the first NMOS transistor N1 is connected to the node Vbsp. The gate of the first NMOS transistor N1 is connected to a node Co2.

The operation of first voltage generation circuit 222a is as follows, and will be described with reference to FIGS. 13 and 16. First, when the amount of the high-side driver is greater than that of the low-side driver, the voltage level of a node Vcm2 which is the output of a steady-state interval modeling circuit 210 is increased. Subsequently, the voltage level of the node Co2 which is the output of a comparator 221 is decreased. Then, as the voltage difference between the gate and the source of the first NMOS transistor N1 is decreased, the amount of the driving current of the first NMOS transistor N1 is decreased. When the amount of the driving current of the first NMOS transistor N1 is decreased, the amount of the driving current of the first PMOS transistor P1 is also decreased. Accordingly, the voltage level of the gate of the first PMOS transistor P1 is increased. That is, the voltage level of the output node Vbsp of the first voltage generation circuit 222a is increased. Due to this, the voltage difference between the source and the gate of the first driving PMOS transistor MP1 of the differential driver is decreased to thereby decrease the amount of the driving current of the high-side driver.

Referring to FIG. 20, a first voltage generation circuit 222b may include a first PMOS transistor P1, first to third NMOS transistors N1 to N3, and first and second switches SW1 and SW2. The source of the first PMOS transistor P1 is connected to a first power supply voltage VDD. The gate and the drain of the first PMOS transistor P1 are connected to each other and connected to a node Vbsp. The source of the first NMOS transistor N1 is connected to a second power supply voltage GND, and the drain thereof is connected to the first switch SW1. The source of the second NMOS transistor N2 is connected to the second power supply voltage GND, and the drain thereof is connected to the second switch SW2. The source of the third NMOS transistor N3 is connected to the second power supply voltage GND, and the drain thereof is connected to a node Vbsp. The gates of the first to third NMOS transistors N1 to N3 are connected to the node Co2. The first and second switches SW1 and SW2 are connected to the node Vbsp and controlled by a high-side voltage adjusting code CDP[1:0].

Except that the high-side voltage adjusting code CDP[1:0] determines whether the first NMOS transistor N1 or the second NMOS transistor N2 is connected, the first voltage generation circuit 222b of FIG. 20 has the same configuration and operation as those of the first voltage generation circuit 222a of FIG. 19. That is, whether the first and second switches SW1 and SW2 are opened or closed is changed according to the high-side voltage adjusting code CDP[1:0]. Accordingly, the amounts of the combined and driving current of the first to third NMOS transistors N1 to N3 which are adjusted by the voltage of the node Co2 are changed. Although not shown, the high-side voltage adjusting code CDP[1:0] may be provided through a host or an external device. In FIG. 20, only two switches SW1 and SW2 and NMOS transistors N1 and N2 are exemplarily illustrated, but each thereof may be configured from two or more elements.

Figure 21:
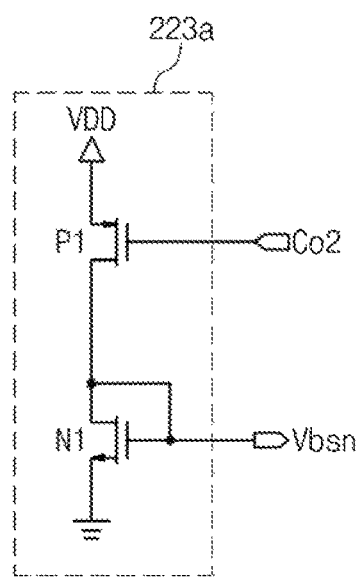
FIGS. 21 and 22 are circuit diagrams exemplarily illustrating a second voltage generation circuit illustrated in FIGS. 16 and 18.
Figure 22:
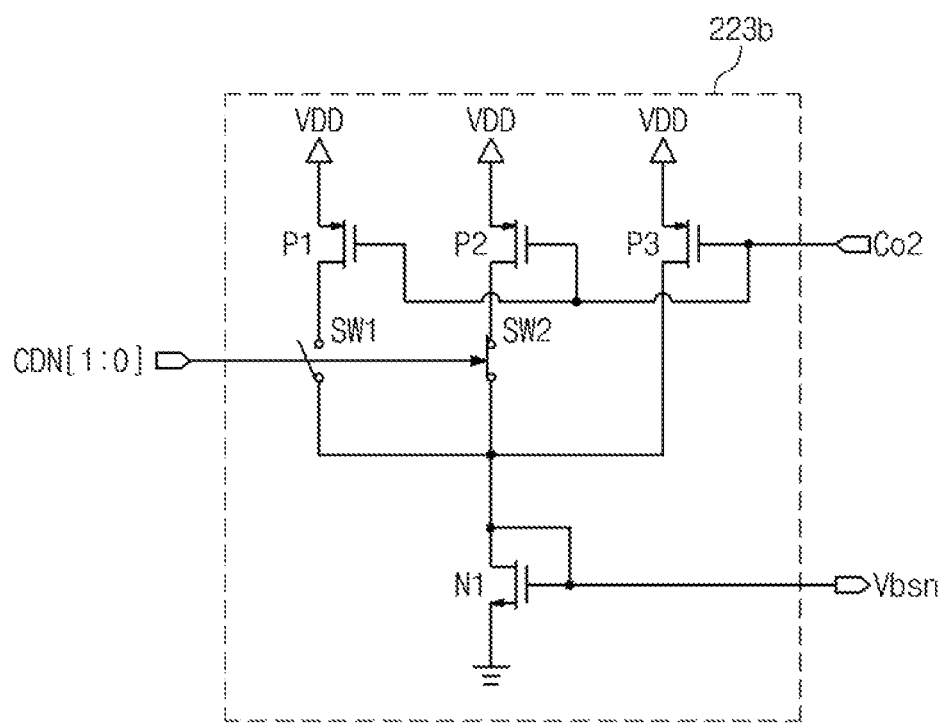

FIGS. 21 and 22 are circuit diagrams exemplarily illustrating a second voltage generation circuit illustrated in FIGS. 16 and 18.

Referring to FIG. 21, a second voltage generation circuit 223a may include a first PMOS transistor P1 and a first NMOS transistor N1. The source of the first PMOS transistor P1 is connected to a first power supply voltage VDD and the gate thereof is connected to a node Co2. The drain of the first PMOS transistor P1 is connected to a node Vbsn. The source of the first NMOS transistor N1 is connected to a second power supply voltage GND. The gate and the drain of the first NMOS transistor N1 are connected to each other and connected to the node Vbsn.

The operation of the second voltage generation circuit 223a is as follows, and will be described with reference to FIGS. 13 and 16. When the amount of the driving current of the high-side driver is greater than that of the low-side driver, the voltage level of the output node Co2 of the comparator 221 is decreased as described in FIG. 19. Subsequently, as the voltage difference between the source and the gate of the first PMOS transistor P1 is increased, the amount of the driving current of the first PMOS transistor P1 is increased. When the amount of the driving current of the first PMOS transistor P1 is decreased, the amount of the driving current of the first NMOS transistor N1 is also decreased. Accordingly, the voltage level of the gate of the first NMOS transistor N1 is increased. That is, the voltage level of the output node Vbsn of the second voltage generation circuit 223a is increased.

Referring to FIG. 22, a second voltage generation circuit 223b may include first to third PMOS transistors P1 to P3, a first NMOS transistor N1, and first and second switches SW1 and SW2. The source of the first PMOS transistor P1 is connected to a first power supply voltage VDD, and the drain thereof is connected to the first switch SW1. The source of the second PMOS transistor P2 is connected to a first power supply voltage VDD, and the drain thereof is connected to the second switch SW2. The source of the third PMOS transistor P3 is connected to the first power supply voltage VDD and the drain thereof is connected to a node Vbsn. The gates of the first to third PMOS transistors P1 to P3 are connected to the node Co2. The first and second switches are connected to the node Vbsn and controlled by a low-side voltage adjusting code CDN[1:0]. The source of the first NMOS transistor N1 is connected to a second power supply voltage GND. The gate and the drain of the first NMOS transistor N1 are connected to each other and connected to the node Vbsn.

Except that the low-side voltage adjusting code CDN[1:0] determines whether the first PMOS transistor P1 or the second PMOS transistor P2 is connected, the voltage generation circuit 223b of FIG. 22 has the same configuration and operation as those of the second voltage generation circuit 223a of FIG. 21. That is, whether the first and second switches SW1 and SW2 are opened or closed is changed according to the low-side voltage adjusting code CDN[1:0]. Accordingly, the amounts of the combined and driving current of the first to third PMOS transistors P1 to P3 which are adjusted by the voltage of the node Co2 are changed. Although not shown, the low-side voltage adjusting code CDN[1:0] may be provided through a host or an external device. In FIG. 22, only two switches SW1 and SW2 and only two PMOS transistors P1 and P2 are exemplarily illustrated, but each thereof may be configured from two or more elements.

Figure 23:
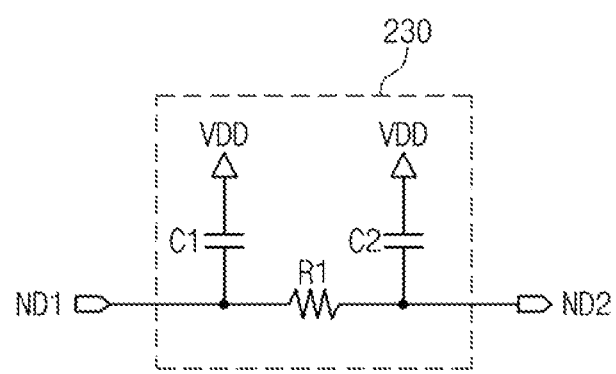
FIG. 23 is a circuit diagram exemplarily illustrating a first slope control circuit illustrated in FIG. 13.

FIG. 23 is a circuit diagram exemplarily illustrating a first slope control circuit illustrated in FIG. 13. Referring to FIG. 23, a first slope control circuit 230 may include first and second capacitors C1 and C2, and a first resistor R1. Except that the first resistor R1 is not a variable resistor, the configuration and the operation of the first slope control circuit 230 of FIG. 23 are the same as those of the first slope control circuit 122a of FIG. 9. Thus, the description regarding this will not be provided.

Figure 24:
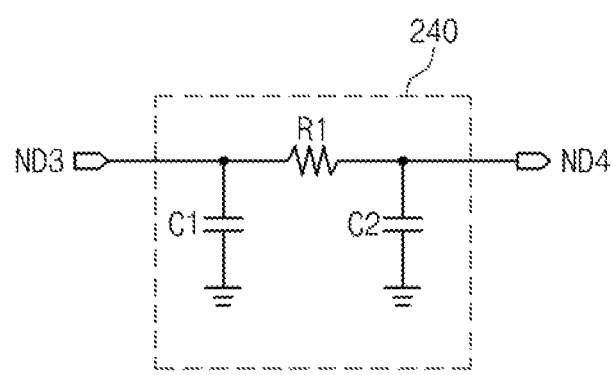
FIG. 24 is a circuit diagram exemplarily illustrating a second slope control circuit illustrated in FIG. 13.

FIG. 24 is a circuit diagram exemplarily illustrating a second slope control circuit illustrated in FIG. 13. Referring to FIG. 24, a second slope control circuit 240 may include first and second capacitors C1 and C2, and a first resistor R1. Except that the first resistor R1 is not a variable resistor, the configuration and the operation of the second slope control circuit 240 of FIG. 24 are the same as those of the second slope control circuit 123a of FIG. 11. Thus, the description regarding this will not be provided.

Figure 25:
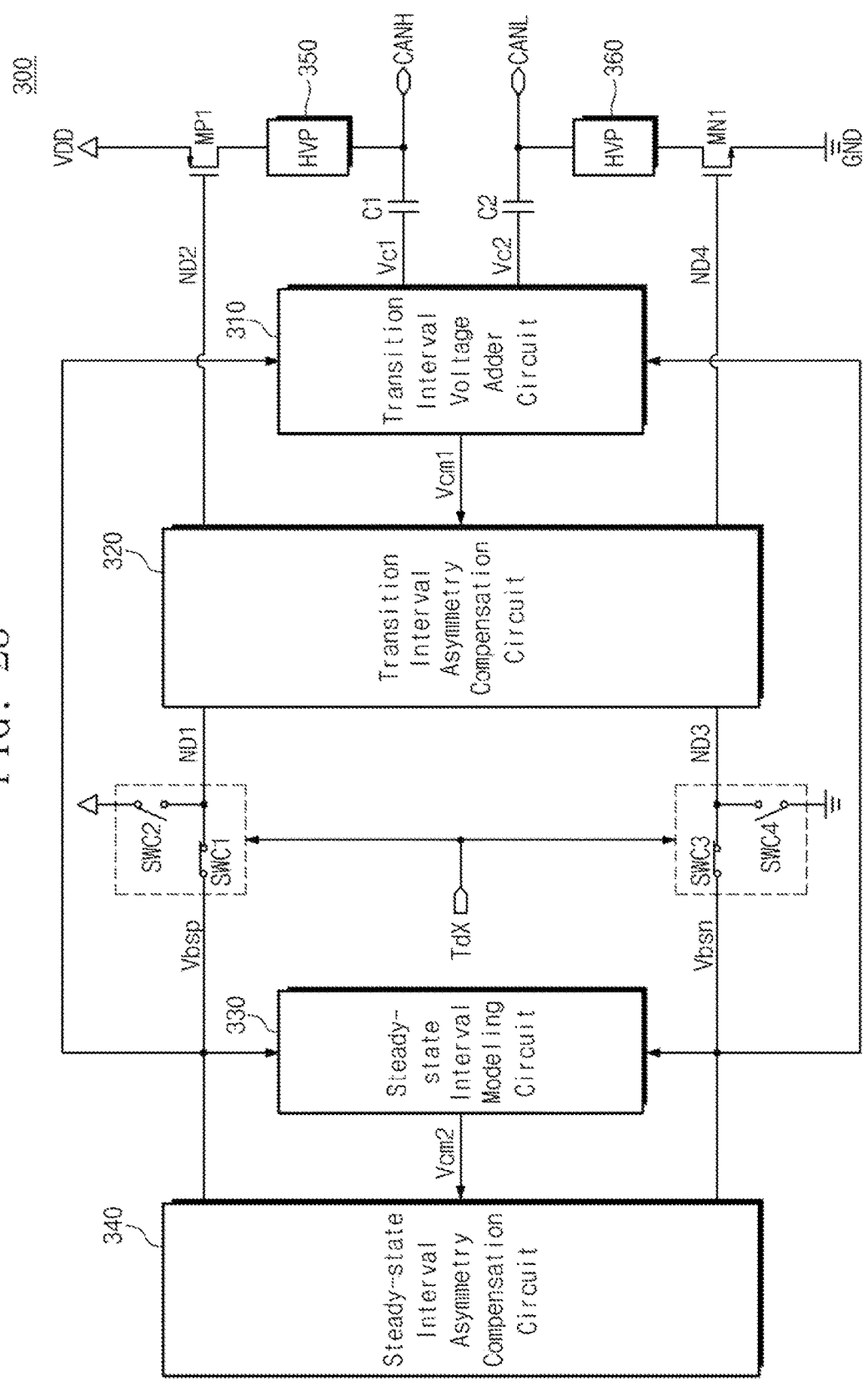
FIG. 25 is a circuit diagram illustrating a differential driving circuit according to another embodiment of the inventive concept.

FIG. 25 is a circuit diagram illustrating a differential driving circuit according to another embodiment of the inventive concept. Referring to FIG. 25, a differential driving circuit 300 may include a first driving PMOS transistor MP1, a first driving NMOS transistor MN1, first and second coupling capacitors C1 and C2, a transition interval voltage adder circuit 310, a transition interval asymmetry compensation circuit 320, a steady-state interval modeling circuit 330, a steady-state interval asymmetry compensation circuit 340, HVPs 350 and 360, high-side and low-side voltage sources Vp and Vn, and first to fourth control switches SWC1 to SWC4. The differential driving circuit 300 of FIG. 25 may compensate the asymmetry between drivers in the transition interval and the steady-state interval by the transition interval and steady-state interval asymmetry compensation circuits 320 and 340. The configuration and the operation of the differential driving circuit 300 are the same as those of the differential driving circuits 10, 100, and 200 respectively illustrated in FIGS. 1, 2, and 13. Thus, the description regarding this will not be provided.

According to an embodiment of the inventive concept, a symmetry characteristic of a differential driving circuit may be monitored in real time to thereby improve the symmetry characteristic. Consequently, the EMI characteristic of the differential driving circuit may be improved.

Hitherto, the best mode was disclosed in the drawings and specification. While specific terms were used, they were not used to limit the meaning or the scope of the present invention described in Claims, but merely used to explain the present invention. Accordingly, a person having ordinary skill in the art will understand from the above that various modifications and other equivalent embodiments are also possible. Hence, the real protective scope of the present invention shall be determined by the technical scope of the accompanying Claims.

What is claimed is:
1. A differential driving circuit comprising:
 a first driver for driving a first pad to a first voltage according to a first driving signal;
 a second driver for driving the second pad to a second voltage according to a second driving signal;
 a first capacitor for receiving a first voltage change of the first pad at one end thereof to transmit the first voltage change to the other end thereof in a transition interval in which voltages of the first and second pads are changed;
 a second capacitor for receiving a second voltage change of the second pad at one end thereof to transmit the second voltage change to the other end thereof in the transition interval;
 a transition interval voltage adder circuit for adding the first and the second voltages respectively transmitted thereto through the first and second capacitors; and
 a transition interval asymmetry compensation circuit for compensating asymmetry between slew rates of the first and second drivers in the transition interval by adjusting a slope of at least one of the first and second driving signals according to the added voltage from the transition interval voltage adder circuit.

2. The differential driving circuit of claim 1, wherein the transition interval asymmetry compensation circuit comprises:
 a comparator for comparing the added voltage from the transition interval voltage adder circuit with a reference voltage to output a voltage difference; and
 a low-side slope adjusting circuit for adjusting a slope of the second driving signal according to the outputted voltage of the comparator.

3. The differential driving circuit of claim 1, wherein the transition interval asymmetry compensation circuit comprises:
 a comparator for comparing the added voltage from the transition interval voltage adder circuit with a reference voltage to output a voltage difference; and
 a high-side slope adjusting circuit for adjusting a slope of the first driving signal according to the outputted voltage of the comparator.

4. The differential driving circuit of claim 3, wherein the transition interval asymmetry compensation circuit further comprises a low-side slope adjusting circuit for adjusting a slope of the second driving signal according to the outputted voltage of the comparator.

5. The differential driving circuit of claim 4, wherein the high-side slope adjusting circuit comprises:
 a variable resistor which receives the first driving signal at one end thereof to transmit the signal to the first driver connected to the other end thereof, and has a resistance value which is variable according to the outputted voltage of the comparator;
 a third capacitor which is connected between the one end of the variable resistor and the first voltage, and determines a rising slope of the first driving signal together with the variable resistor; and
 a fourth capacitor which is connected between the other end of the variable resistor and the first voltage, and determines a falling slope of the first driving signal together with the variable resistor.

6. The differential driving circuit of claim 4, wherein the low-side slope adjusting circuit comprises:
   a variable resistor which receives the second driving signal at one end thereof to transmit the signal to the second driver connected to the other end thereof, and has a resistance value which is variable according to the outputted voltage of the comparator;
   a third capacitor which is connected between the one end of the variable resistor and the second voltage, and determines a falling slope of the second driving signal together with the variable resistor; and
   a fourth capacitor which is connected between the other end of the variable resistor and the second voltage, and determines a rising slope of the second driving signal together with the variable resistor.

7. The differential driving circuit of claim 1, further comprising:
   a first control switch for transmitting a first bias signal as the first driving signal according to a data signal; and
   a second control switch for transmitting a second bias signal as the second driving signal according to the data signal,
   wherein a voltage level of the first bias signal is a voltage level for driving the first driver, and a voltage level of the second bias signal is a voltage level for driving the second driver.

8. The differential driving circuit of claim 7, wherein the transition interval voltage adder circuit comprises:
   a third driver modeling the first driver;
   a fourth driver modeling the second driver;
   first and second modeling resistors connected between the third and fourth drivers in series; and
   a node connected with first and second modeling resistors,
   wherein the third driver is driven by the first bias signal, and the fourth driver is driven by the second bias signal, and the transition interval voltage adder circuit respectively receives voltages transmitted through the first and second capacitors at the node to output an added voltage.

9. The differential driving circuit of claim 7, further comprising:
   a steady-state interval modeling circuit for monitoring asymmetry characteristic of amounts of driving currents of the first and second drivers; and
   a steady-state interval asymmetry compensation circuit compensates asymmetry of the amounts of the first and second drivers by adjusting at least one of voltage level of the first bias signal and voltage level of the second bias signal according to the output voltage from the steady-state interval modeling circuit in the steady-state interval in which voltage levels of the first and second pads are maintained.

10. The differential driving circuit of claim 9, wherein the steady-state interval modeling circuit comprises:
    a third driver modeling the first driver;
    a fourth driver modeling the second driver;
    first and second modeling resistors connected between the third and fourth drivers in series; and
    a node connected with first and second modeling resistors,
    wherein the third driver is driven by the first bias signal, and the fourth driver is driven by the second bias signal, and the steady-state interval modeling circuit outputs a voltage of the node.

11. The differential driving circuit of claim 9, wherein the steady-state interval asymmetry compensation circuit comprises:
    a comparator for comparing the output voltage from the steady-state interval modeling circuit with a reference voltage to output a voltage difference; and
    a low-side voltage generation circuit for adjusting a voltage level of the second bias signal according to the output voltage of the comparator.

12. The differential driving circuit of claim 9, wherein the steady-state interval asymmetry compensation circuit comprises:
    a comparator for comparing the output voltage from the steady-state interval modeling circuit with a reference voltage to output a voltage difference; and
    a high-side voltage generation circuit for adjusting a voltage level of the first bias signal according to the output voltage of the comparator.

13. The differential driving circuit of claim 12, wherein the steady-state interval asymmetry compensation circuit further comprises a low-side voltage generation circuit for adjusting a voltage level of the second bias signal according to the output voltage of the comparator.

14. The differential driving circuit of claim 13, wherein the high-side voltage generation circuit comprises a PMOS transistor and a low-side variable current source, wherein
    the PMOS transistor receives the first voltage at one end thereof, is connected with the low-side variable current source in series at the other end thereof, and is connected with a gate terminal at the other end thereof to output the first bias signal through the gate terminal, and
    the low-side variable current source is connected so as to supply current from the other end of the PMOS transistor to the second voltage, and has a current value which is variable according to the output voltage of the comparator.

15. The differential driving circuit of claim 13, wherein the low-side voltage generation circuit comprises an high-side variable current source and an NMOS transistor, wherein
    the high-side variable current source is connected so as to supply current from the first voltage to the one end of the NMOS transistor and has a current value which is variable according to the output voltage of the comparator, and
    the NMOS transistor is connected to the high-side variable current source in series at the one end thereof, is connected to the second voltage at the other end thereof, is connected to a gate terminal at the one end thereof to output the second bias signal through the gate terminal.

16. The differential driving circuit of claim 1, wherein
    the first driver comprises at least one PMOS transistor for driving the first pad to the first voltage according to the first driving signal, and
    the second driver comprises at least one NMOS transistor for driving the second pad to the second voltage according to the second driving signal.

17. The differential driving circuit of claim 1, wherein the differential driving circuit drives a controller area network (CAN) bus.

* * * * *